(12) United States Patent
Baek et al.

(10) Patent No.: US 12,166,160 B2
(45) Date of Patent: Dec. 10, 2024

(54) DISPLAY DEVICE AND METHOD OF MANUFACTURING THE SAME

(71) Applicant: Samsung Display Co., LTD., Yongin-si (KR)

(72) Inventors: Jin Won Baek, Hwaseong-si (KR); Lae Ho Kim, Hwaseong-si (KR); Sang Woong Baek, Seoul (KR); Young Geun Cho, Seoul (KR); Chung Sic Choi, Hwaseong-si (KR)

(73) Assignee: SAMSUNG DISPLAY CO., LTD., Yongin-si (KR)

(*) Notice: Subject to any disclaimer, the term of this patent is extended or adjusted under 35 U.S.C. 154(b) by 432 days.

(21) Appl. No.: 17/528,745

(22) Filed: Nov. 17, 2021

(65) Prior Publication Data
US 2022/0165928 A1   May 26, 2022

(30) Foreign Application Priority Data

Nov. 24, 2020   (KR) .................. 10-2020-0158953

(51) Int. Cl.
| | |
|---|---|
| *H01L 21/00* | (2006.01) |
| *H01L 25/16* | (2023.01) |
| *H01L 33/00* | (2010.01) |
| *H01L 33/62* | (2010.01) |

(52) U.S. Cl.
CPC ............ *H01L 33/62* (2013.01); *H01L 25/167* (2013.01); *H01L 33/005* (2013.01); *H01L 2933/0066* (2013.01)

(58) Field of Classification Search
CPC ..... H01L 33/62; H01L 25/167; H01L 33/005; H01L 2933/0066
See application file for complete search history.

(56) References Cited

U.S. PATENT DOCUMENTS

| | | | |
|---|---|---|---|
| 11,018,089 B2* | 5/2021 | Chen | H01L 33/502 |
| 2022/0165911 A1* | 5/2022 | Kang | H01L 33/005 |

FOREIGN PATENT DOCUMENTS

| | | |
|---|---|---|
| KR | 10-1429095 | 8/2014 |
| KR | 10-1436123 | 11/2014 |
| KR | 10-1490758 | 2/2015 |
| KR | 10-2020-0034905 | 4/2020 |

* cited by examiner

*Primary Examiner* — Richard A Booth
(74) *Attorney, Agent, or Firm* — KILE PARK REED & HOUTTEMAN PLLC

(57) ABSTRACT

An apparatus for manufacturing a display device includes a stage, a first electric field applying module including first probe pins and disposed on a first side of the stage, a light irradiation module including light-emitting elements and disposed on the stage, and a first voltage output module that outputs an emission driving signal that drives the light-emitting elements, outputs a first alignment signal to one of the first probe pins, and outputs a second alignment signal to another one of the first probe pins.

25 Claims, 29 Drawing Sheets

DISPLAY DEVICE AND METHOD OF MANUFACTURING THE SAME

CROSS-REFERENCE TO RELATED APPLICATION(S)

This application claims priority to and benefits of Korean Patent Application No. 10-2020-0158953 under 35 U.S.C. § 119 filed in the Korean Intellectual Property Office on Nov. 24, 2020, the entire contents of which are incorporated herein by reference.

BACKGROUND

1. Technical Field

The disclosure relates to a display device and a method of manufacturing the same.

2. Description of the Related Art

Display devices are becoming more important with developments in multimedia technology. Accordingly, various display devices such as an organic light-emitting diode (OLED) display device, a liquid crystal display (LCD) device, and the like have been used.

A display device may include a display panel for displaying an image or images, such as a light-emitting display panel or an LCD panel. The light-emitting display panel can display an image or images by emitting light with the use of light-emitting elements. As an example, light-emitting diodes (LEDs) such as OLEDs, which use an organic material as a fluorescent material, and inorganic LEDs, which use an inorganic material as a fluorescent material, can be used as the light-emitting elements.

It is to be understood that this background of the technology section is, in part, intended to provide useful background for understanding the technology. However, this background of the technology section may also include ideas, concepts, or recognitions that were not part of what was known or appreciated by those skilled in the pertinent art prior to a corresponding effective filing date of the subject matter disclosed herein.

SUMMARY

Embodiments may provide an apparatus for manufacturing a display device capable of improving the precision of alignment of light-emitting elements.

Embodiments also provide a method of manufacturing a display device capable of improving the precision of alignment of the light-emitting elements.

Additional features of embodiments will be set forth in the description which follows, and in part may be apparent from the description, or may be learned by practice of an embodiment or embodiments herein.

According to an embodiment, an apparatus for manufacturing a display device may include a stage; a first electric field applying module including first probe pins and disposed on a first side of the stage; a light irradiation module including light-emitting elements and disposed on the stage; and a first voltage output module that outputs an emission driving signal that drives the light-emitting elements, outputs a first alignment signal to one of the first probe pins, and outputs a second alignment signal to another one of the first probe pins.

The first alignment signal of the first voltage output module may be a ground voltage or a direct current voltage, and the second alignment signal of the first voltage output module may be an alternating current voltage.

The second alignment signal of the first voltage output module may increase from a first low-level voltage to a first high-level voltage and may decrease from the first high-level voltage to the first low-level voltage.

The emission driving signal of the first voltage output module may have a second high-level voltage during a period in which the second alignment signal of the first voltage output module is switched from a first-level voltage to a second-level voltage and may have a second low-level voltage lower than the second high-level voltage during other periods.

The first-level voltage and the second-level voltage may be lower than the first high-level voltage and higher than the first low-level voltage of the first voltage output module.

The second alignment signal of the first voltage output module may have a sawtooth waveform such that a period over which the second alignment signal increases from the first low-level voltage to the first high-level voltage is shorter than a period over which the second alignment signal of the first voltage output module decreases from the first high-level voltage to the first low-level voltage of the first voltage output module.

The second alignment signal of the first voltage output module may have a ramp waveform such that a period over which the second alignment signal of the first voltage output module increases from the first low-level voltage to the first high-level voltage is longer than a period over which the second alignment signal decreases from the first high-level voltage to the first low-level voltage of the first voltage output module.

The apparatus may further include a second electric field applying module including second probe pins and disposed on a second side of the stage; and a second voltage output module outputting the first alignment signal to one of the second probe pins and outputting the second alignment signal to another one of the second probe pins.

The first voltage output module may be disposed on the first side of the stage. The second voltage output module may be disposed on the second side of the stage. The first side of the stage may be opposite to the second side of the stage.

The apparatus may further include an optical device disposed on the light irradiation module and overlapping a through hole of the light irradiation module.

The apparatus may further include a sensor device including a light detection sensor that detects light from the light irradiation module; and a temperature sensor that detects a temperature of the stage.

The stage may include a sensor groove in which the sensor device may be inserted.

The stage may include a line hole that penetrates the stage.

The apparatus may further include a sensor connecting line electrically connected to the sensor device and disposed in the line hole.

The apparatus may further include a first module mover lifting up or down the first electric field applying module and a stage mover lifting up or down the stage.

According to an embodiment, a method of manufacturing a display device may include disposing a substrate onto supporting pins that protrude from a top surface of a stage; lowering a first electric field applying module such that alignment pads of the substrate contact first probe pins of the first electric field applying module, the first electric field applying module being disposed on a first side of the stage; seating the substrate on the stage by raising the stage; applying light to the substrate by applying a first alignment signal to first alignment pads by the first probe pins of the first electric field applying module; applying a second alignment signal to second alignment pads by the first probe pins of the first electric field applying module; and applying an emission driving signal to a light irradiation module disposed on the stage.

The first alignment signal applied to the first alignment pads may be a ground voltage or a direct current voltage, and the second alignment signal applied to the second alignment pads may be an alternating current voltage.

The second alignment signal applied to the second alignment pads may increase from a first low-level voltage to a first high-level voltage and may decrease from the first high-level voltage to the first low-level voltage.

The emission driving signal applied to the light irradiation module may have a second high-level voltage during a period in which the second alignment signal applied to the second alignment pads is switched from a first-level voltage to a second-level voltage and may have a second low-level voltage lower than the second high-level voltage during other periods.

The first-level voltage and the second-level voltage may be lower than the first high-level voltage and higher than the first low-level voltage.

The second alignment signal applied to the second alignment pads may have a sawtooth waveform such that a period over which the second alignment signal applied to the second alignment pads increases from the first low-level voltage to the first high-level voltage is shorter than a period over which the second alignment signal applied to the second alignment pads decreases from the first high-level voltage to the first low-level voltage.

The second alignment signal applied to the second alignment pads may have a ramp waveform such that a period over which the second alignment signal applied to the second alignment pads increases from the first low-level voltage to the first high-level voltage is longer than a period over which the second alignment signal applied to the second alignment pads decreases from the first high-level voltage to the first low-level voltage.

The method may further include applying light to the light irradiation module to preheat the stage before the disposing the substrate onto the supporting pins.

The stage may be preheated to a temperature in a range of about 50° C. to about 70° C.

The method may further include raising the first electric field applying module; lowering the stage; and ejecting the substrate.

According to an embodiment, ultraviolet (UV) light or blue light is applied to display panel cells of a mother substrate via a light irradiation module, and first and second alignment signals are applied to first and second alignment lines of each of the display panels via first and second electric field applying modules. As active layers of light-emitting elements of each of the display panel cells are excited by the UV light or the blue light from the light irradiation module, permanent dipole moments may be generated in a direction from second semiconductor layers of the light-emitting elements, which are doped with a p-type dopant, to first semiconductor layers of the light-emitting elements, which are doped with an n-type dopant. Thus, as a dielectrophoretic force is applied to the light-emitting elements by an electric field, the second semiconductor layers of the light-emitting elements can be placed near the first alignment line. For example, the light-emitting elements can be deflected, and the precision of alignment of the light-emitting elements can be improved.

Other features and embodiments may be apparent from the following detailed description, the drawings, and the claims.

BRIEF DESCRIPTION OF THE DRAWINGS

The accompanying drawings, which are included to provide a further understanding of the disclosure, illustrate embodiments in which.

DETAILED DESCRIPTION OF THE EMBODIMENTS

Figure 1:
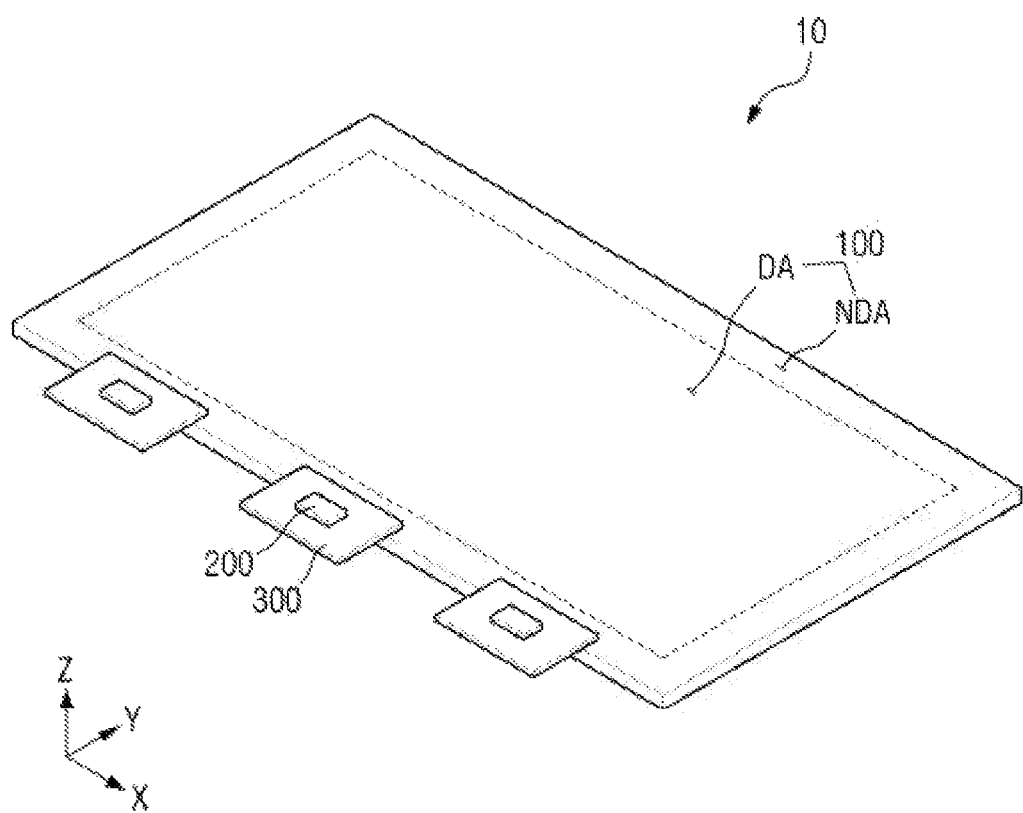
FIG. 1 is a schematic perspective view of a display device according to an embodiment.

The embodiments will now be described more fully hereinafter with reference to the accompanying drawings. The embodiments may, however, be provided in different forms and should not be construed as limiting. The same reference numbers indicate the same components throughout the disclosure. In the accompanying figures, the thickness of layers and regions may be exaggerated for clarity.

Some of the parts which are not associated with the description may not be provided in order to describe embodiments of the disclosure.

It will also be understood that when a layer is referred to as being "on" another layer or substrate, it can be directly on the other layer or substrate, or intervening layers may also be present. In contrast, when an element is referred to as being "directly on" another element, there may be no intervening elements present.

Further, the phrase "in a plan view" means when an object portion is viewed from above, and the phrase "in a schematic cross-sectional view" means when a schematic cross-section taken by vertically cutting an object portion is viewed from the side. The terms "overlap" or "overlapped" mean that a first object may be above or below or to a side of a second object, and vice versa. Additionally, the term "overlap" may include layer, stack, face or facing, extending over, covering, or partly covering or any other suitable term as would be appreciated and understood by those of ordinary skill in the art. The expression "not overlap" may include "apart from" or "set aside from" or "offset from" and any other suitable equivalents as would be appreciated and understood by those of ordinary skill in the art. The terms "face" and "facing" mean that a first object may directly or indirectly oppose a second object. In a case in which a third object intervenes between a first and second object, the first and second objects may be understood as being indirectly opposed to one another, although still facing each other.

The spatially relative terms "below", "beneath", "lower", "above", "upper", or the like, may be used herein for ease of description to describe the relations between one element or component and another element or component as illustrated in the drawings. It will be understood that the spatially relative terms are intended to encompass different orientations of the device in use or operation, in addition to the orientation depicted in the drawings. For example, in the case where a device illustrated in the drawing is turned over, the device positioned "below" or "beneath" another device may be placed "above" another device. Accordingly, the illustrative term "below" may include both the lower and upper positions. The device may also be oriented in other directions and thus the spatially relative terms may be interpreted differently depending on the orientations.

When an element is referred to as being "connected" or "coupled" to another element, the element may be "directly connected" or "directly coupled" to another element, or "electrically connected" or "electrically coupled" to another element with one or more intervening elements interposed therebetween. It will be further understood that when the terms "comprises," "comprising," "has", "have", "having", "includes" and/or "including" are used, they may specify the presence of stated features, integers, steps, operations, elements and/or components, but do not preclude the presence or addition of other features, integers, steps, operations, elements, components, and/or any combination thereof.

It will be understood that, although the terms "first," "second," "third," or the like may be used herein to describe various elements, these elements should not be limited by these terms. These terms are used to distinguish one element from another element or for the convenience of description and explanation thereof. For example, when "a first element" is discussed in the description, it may be termed "a second element" or "a third element," and "a second element" and "a third element" may be termed in a similar manner without departing from the teachings herein.

"About" or "approximately" as used herein is inclusive of the stated value and means within an acceptable range of deviation for the particular value as determined by one of ordinary skill in the art, considering the measurement in question and the error associated with measurement of the particular quantity (for example, the limitations of the measurement system). For example, "about" may mean within one or more standard deviations, or within ±30%, 20%, 10%, 5% of the stated value.

In the specification and the claims, the term "and/or" is intended to include any combination of the terms "and" and "or" for the purpose of its meaning and interpretation. For example, "A and/or B" may be understood to mean "A, B, or A and B." The terms "and" and "or" may be used in the conjunctive or disjunctive sense and may be understood to be equivalent to "and/or." In the specification and the claims, the phrase "at least one of" is intended to include the meaning of "at least one selected from the group of" for the purpose of its meaning and interpretation. For example, "at least one of A and B" may be understood to mean "A, B, or A and B."

Unless otherwise defined or implied, all terms used herein (including technical and scientific terms) have the same meaning as commonly understood by those skilled in the art to which this disclosure pertains. It will be further understood that terms, such as those defined in commonly used dictionaries, should be interpreted as having a meaning that is consistent with their meaning in the context of the relevant art and will not be interpreted in an ideal or excessively formal sense unless clearly defined in the specification.

FIG. 1 is a schematic perspective view of a display device according to an embodiment.

Referring to FIG. 1, a display device 10, which is a device displaying a moving or still image, may be used not only in a portable electronic device (for example, a mobile phone, a smartphone, a tablet personal computer (PC), a smartwatch, a watchphone, a mobile communication terminal, an electronic notepad, an electronic book, a portable multimedia player (PMP), a navigation device, or an ultramobile PC (UMPC)), but also in various other products such as a television (TV), a notebook computer, a monitor, a billboard, or an Internet-of-Things (IoT) device.

The display device 10 is illustrated as being, for example, an inorganic light-emitting display device including inorganic semiconductor elements as its light-emitting elements, but the disclosure is not limited thereto.

The display device 10 may include a display panel 100, display driving circuits 200, and circuit boards 300.

The display panel 100 may be formed in a substantially rectangular shape having long sides in a first direction (or an X-axis direction) and short sides in a second direction (or a Y-axis direction) in a plan view. The corners where the long sides and the short sides of the display panel 100 meet may be rounded to have a curvature or may be right-angled. The substantially planar shape of the display panel 100 is not particularly limited, and the display panel 100 may be formed in various other shapes such as another substantially polygonal shape, a substantially circular shape, or a substantially elliptical shape. The display panel 100 may be formed to be flat, but the disclosure is not limited thereto. In one example, the display panel 100 may include curved portions having a uniform or varying curvature. The display panel 100 may be formed to be flexible such as foldable, bendable, or rollable.

The display panel 100 may include a display area DA, which displays an image, and a non-display area NDA, which is disposed around the display area DA. As an example, a substrate SUB1 (of FIG. 5) of the display panel 100 may include the display area DA and the non-display area NDA.

The display area DA may account for most of the display panel 100. The display area DA may be disposed in the middle of the display panel 100. Pixels PX (of FIG. 2) may be disposed in the display are DA to display an image.

The non-display area NDA may be disposed adjacent to the display area DA. The non-display area NDA may be an area outside the display area DA. The non-display area NDA may be disposed to surround or may be adjacent to the display area DA. The non-display area NDA may be an edge area of the display panel 100.

Display pads DP, which are to be electrically connected to circuit boards 300, may be disposed in the non-display area NDA. The display pads DP may be disposed on a side of the display panel 100. In one example, the display pads DP may be disposed on a lower side of the display panel 100.

Circuit boards 300 may be disposed on the display pads DP, which are disposed along an edge of the display panel 100. FIG. 1 illustrates that there are provided three circuit boards 300, but the number of circuit boards 300 is not particularly limited.

The circuit boards 300 may be attached to the display pads DP or scan pads SP (of FIG. 2) via a low-resistance, high-reliability material such as an anisotropic conductive film (ACF) or a self-assembly anisotropic conductive paste (SAP). As a result, the circuit boards 300 may be electrically connected to data lines DL (of FIG. 2) and scan control lines SCL (of FIG. 2) of the display panel 100. The display panel 100 may receive data voltages and scan control signals via the circuit boards 300. The circuit boards 300 may be flexible films such as flexible printed circuit boards (FPCBs), printed circuit boards (PCBs), or chip-on-films (COFs).

Display driving circuits 200 may generate the data voltages and the scan control signals. The display driving circuits 200 may provide the data voltages and the scan control signals to the display panel 100 via the circuit boards 300. As an example, the scan control signals may be generated by a timing driving circuit, rather than by the display driving circuits 200, and may be provided to the display panel 100 via the circuit boards 300.

The display driving circuits 200 may be formed as integrated circuits (ICs) and may be attached on the circuit boards 300. As an example, the display driving circuits 200 may be attached on the display panel 100 in a chip-on-glass (COG) or chip-on-plastic (COP) manner or via ultrasonic bonding.

Figure 2:
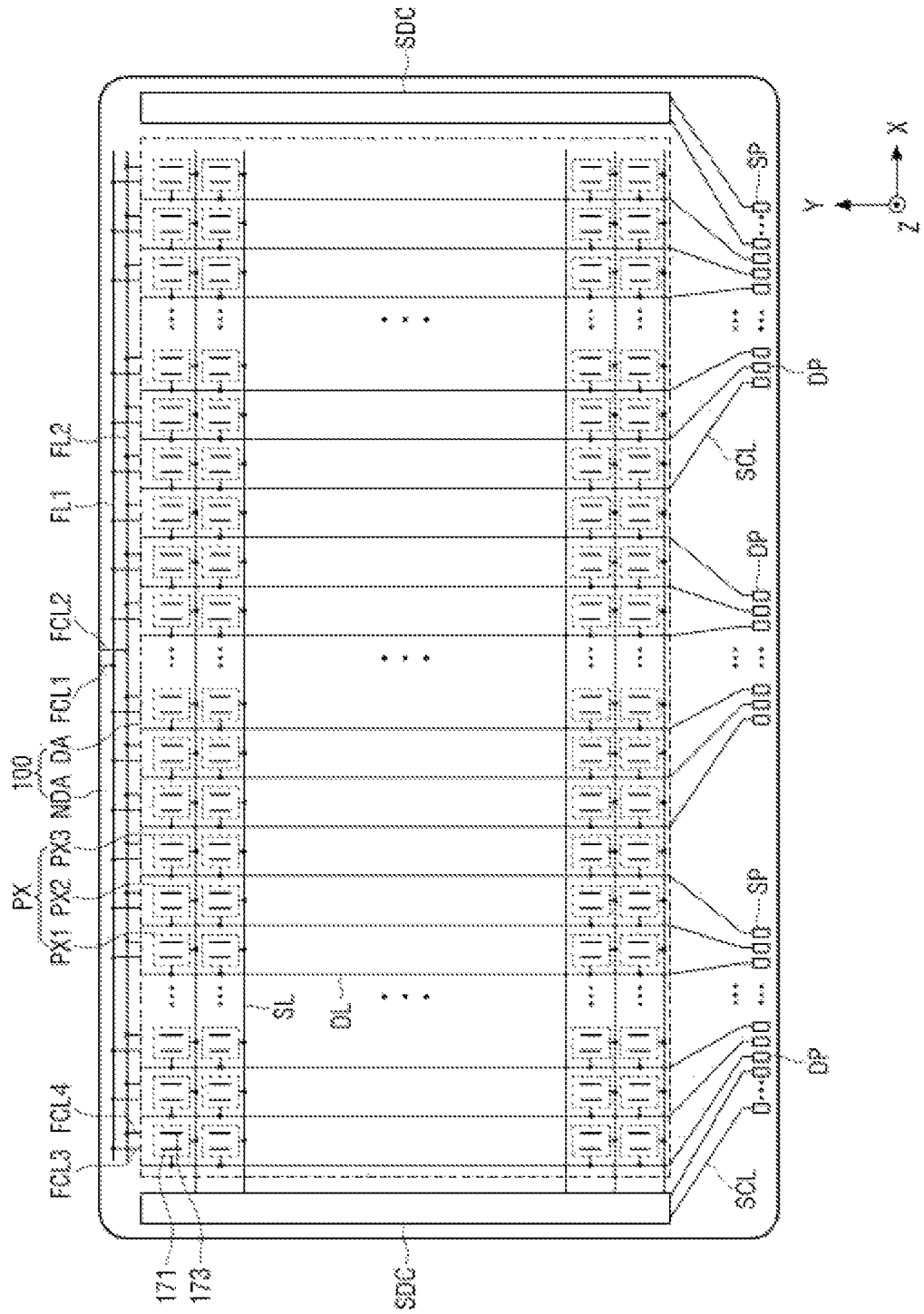
FIG. 2 is a schematic layout view of a display panel of FIG. 1.

FIG. 2 is a schematic layout view of the display panel of FIG. 1.

Referring to FIG. 2, the display panel 100 may include the pixels PX, scan drivers SDC, scan lines SL, the data lines DL, floating lines (FL1 and FL2), connecting lines (FCL1, FCL2, FCL3, and FCL4), the display pads DP, and the scan pads SP.

The pixels PX, the scan lines SL, and the data lines DL may be disposed in the display area DA of the display panel 100.

The scan lines SL may extend in the first direction (or the X-axis direction) and may be arranged or disposed along the second direction (or the Y-axis direction). The scan lines SL may be electrically connected to the scan drivers SDC. Scan signals from the scan drivers SDC may be applied to the scan lines SL.

The data lines DL may extend in the second direction (or the Y-axis direction) and may be arranged or disposed along the first direction (or the X-axis direction). The data lines DL may be electrically connected to the display pads DP. As a result, the data lines DL may be electrically connected to the display driving circuits 200 of the circuit boards 300 via the display pads DP. Data voltages from the display driving circuit 200 may be applied to the data lines DL.

Each of the pixels PX may include subpixels. FIG. 2 illustrates that each of the pixels PX may include three subpixels, for example, first, second, and third subpixels PX1, PX2, and PX3, but the number of subpixels included in each of the pixels PX is not particularly limited.

Subpixels (PX1, PX2, and PX3) may be arranged or disposed in the first direction (or the X-axis direction) and the second direction (or the Y-axis direction). For example, the subpixels (PX1, PX2, and PX3) may be arranged or disposed in a matrix. First subpixels PX1, second subpixels PX2, and third subpixels PX3 may be alternately arranged or disposed in the first direction (or the X-axis direction). The first subpixels PX1 may be arranged or disposed along the second direction (or the Y-axis direction), the second subpixels PX2 may be arranged or disposed along the second direction (or the Y-axis direction), and the third subpixels PX3 may be arranged or disposed along the second direction (or the Y-axis direction).

Each of the subpixels (PX1, PX2, and PX3) may include first and second electrodes 171 and 173. The first and second electrodes 171 and 173 may extend in the second direction (or the Y-axis direction) and may be adjacent to each other in the first direction (or the X-axis direction).

First electrodes 171 of the subpixels (PX1, PX2, and PX3) may be disposed to be spaced apart from one another, and second electrodes 173 of the subpixels (PX1, PX2, and PX3) may be disposed to be spaced apart from one another. In one example, first electrodes 171 of a pair of adjacent subpixels (PX1, PX2, and PX3) in the first direction (or the X-axis direction) and the second direction (or the Y-axis direction) may be disposed to be spaced apart from each other, and second electrodes 173 of the pair of adjacent subpixels (PX1, PX2, and PX3) in the first direction (or the X-axis direction) and the second direction (or the Y-axis direction) may be disposed to be spaced apart from each other.

Light-emitting elements 172 (of FIG. 3) may be disposed between the first and second electrodes 171 and 173 of each of the subpixels (PX1, PX2, and PX3). First ends of the light-emitting elements 172 may be electrically connected to the first electrode 171, and second ends of the light-emitting elements 172 may be electrically connected to the second electrode 173. As a result, the light-emitting elements 172 may emit light in accordance with a driving current that flows from the first electrode 171 to the second electrode 173.

The scan drivers SDC, the scan control lines SCL, the floating lines (FL1 and FL2), the connecting lines (FCL1, FCL2, FCL3, and FCL4), the display pads DP, and the scan pads SP may be disposed in the non-display area NDA of the display panel 100.

The scan drivers SDC may be electrically connected to the scan pads SP via the scan control lines SCL. As a result, the scan drivers SDC may be electrically connected to the circuit boards 300 via the scan pads SP. Thus, scan control signals from the circuit boards 300 may be applied to the scan drivers SDC. The scan drivers SDC may generate scan signals in accordance with the scan control signals and may provide the scan signals to the scan lines SL.

FIG. 2 illustrates that the scan drivers SDC are disposed in portions of the non-display area NDA on the outer left and outer right sides of the display area DA, but the disclosure is not limited thereto. As an example, the scan drivers SDC may be disposed in portions of the non-display area NDA on only the left side of the display area DA or only the right side of the display area DA.

The floating lines (FL1 and FL2) and the connecting lines (FCL1, FCL2, FCL3, and FCL4) may be elements that remain on the display panel 100 after the application of first and second alignment signals for aligning light-emitting elements 172 in each of the subpixels (PX1, PX2, and PX3) during the fabrication of the display device 10. Thus, the floating lines (FL1 and FL2) and the connecting lines (FCL1, FCL2, FCL3, and FCL4) may not be connected to, and electrically isolated from, other elements of the display panel 100, for example, the first and second electrodes 171 and 172 of each of the subpixels (PX1, PX2, and PX3), the scan lines SL, and the data lines DL. A ground voltage or a direct current (DC) voltage may be applied to the floating lines (FL1 and FL2) and the connecting lines (FCL1, FCL2, FCL3, and FCL4) to prevent static electricity.

The floating lines (FL1 and FL2) may extend in the first direction (or the X-axis direction) and may be arranged or disposed along the second direction (or the Y-axis direction). The floating lines (FL1 and FL2) may be disposed in a portion of the non-display area NDA on the outer upper side of the display area DA.

Figure 6:
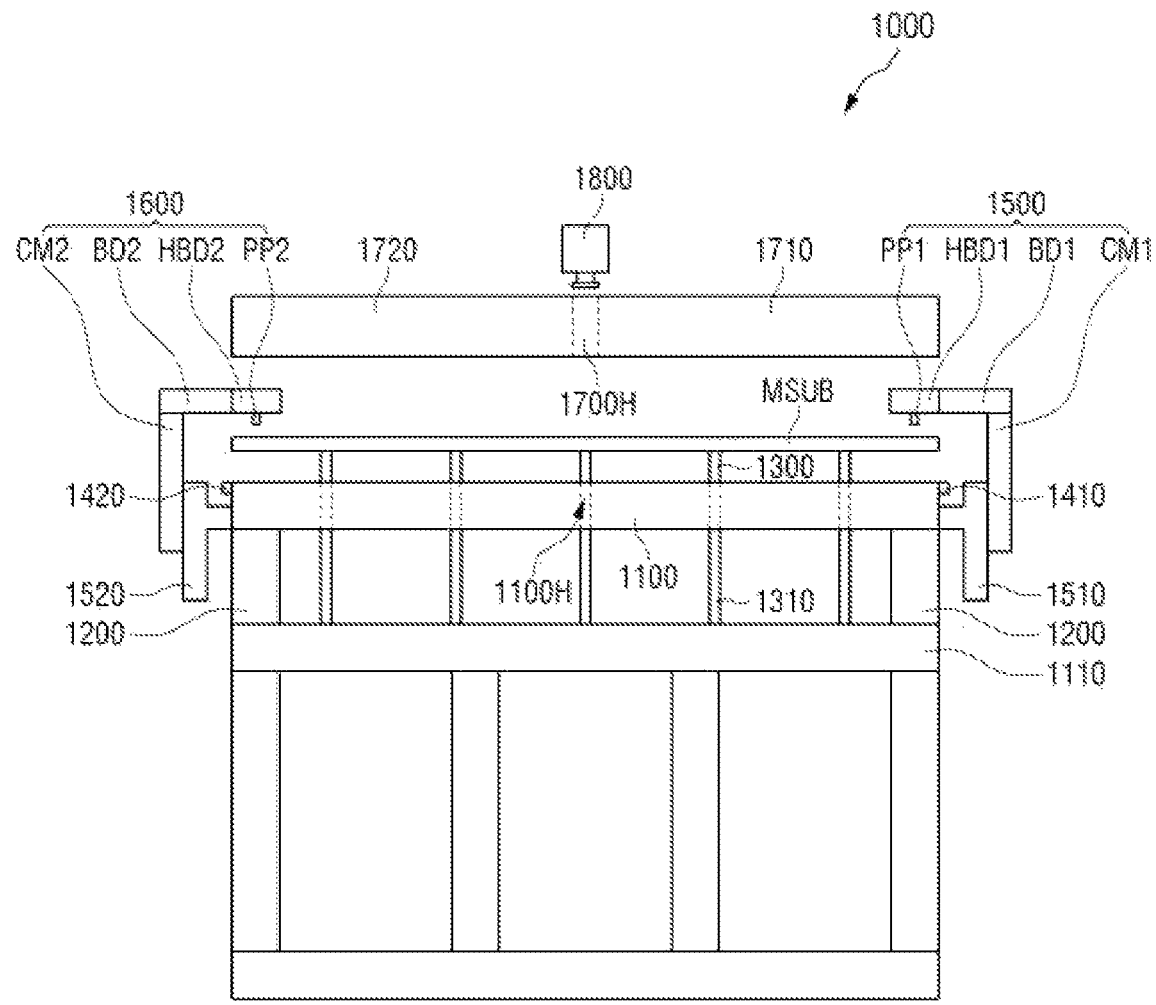
FIG. 6 is a side view of an apparatus for manufacturing a display device according to an embodiment.

A first floating line FL1 may be connected to first connecting lines FCL1 and third connecting lines FCL3. The first connecting lines FCL1 and the third connecting lines FCL3 may extend in the second direction (or the Y-axis direction). The first connecting lines FCL1 may extend from the first floating line FL1 in an upward direction from the display panel 100. The third connecting lines FCL3 may extend from the first floating line FL1 in a direction toward the display area DA. The first connecting lines FCL1 may be electrically connected to first alignment pads AP1 of a mother substrate MSUB, as illustrated in FIG. 6.

A second floating line FL2 may be connected to second connecting lines FCL2 and fourth connecting lines FCL4. The second connecting lines FCL2 and the fourth connecting lines FCL4 may extend in the second direction (or the Y-axis direction). The second connecting lines FCL2 may extend from the second floating line FL2 in the upward direction from the display panel 100. The fourth connecting lines FCL4 may extend from the second floating line FL2 in the direction toward the display area DA. The second connecting lines FCL2 may be electrically connected to second alignment pads AP2 of the mother substrate MSUB, as illustrated in FIG. 6.

The display pads DP and the scan pads SP may be disposed in a portion of the non-display area NDA on the outer lower side of the display area DA. Circuit boards 300 disposed on the left or right side of the array of the circuit boards 300 may be electrically connected to the display pads DP and the scan pads SP, whereas circuit boards 300 in the middle of the array of the circuit boards 300 may be electrically connected to the display pads DP. The scan pads SP electrically connected to the circuit boards 300 on the left side of the array of the circuit boards 300 may be disposed on the left side of the array of the display pads DP. The scan pads SP electrically connected to the circuit boards 300 on the right side of the array of the circuit boards 300 may be disposed on the right side of the array of the display pads DP.

Figure 3:
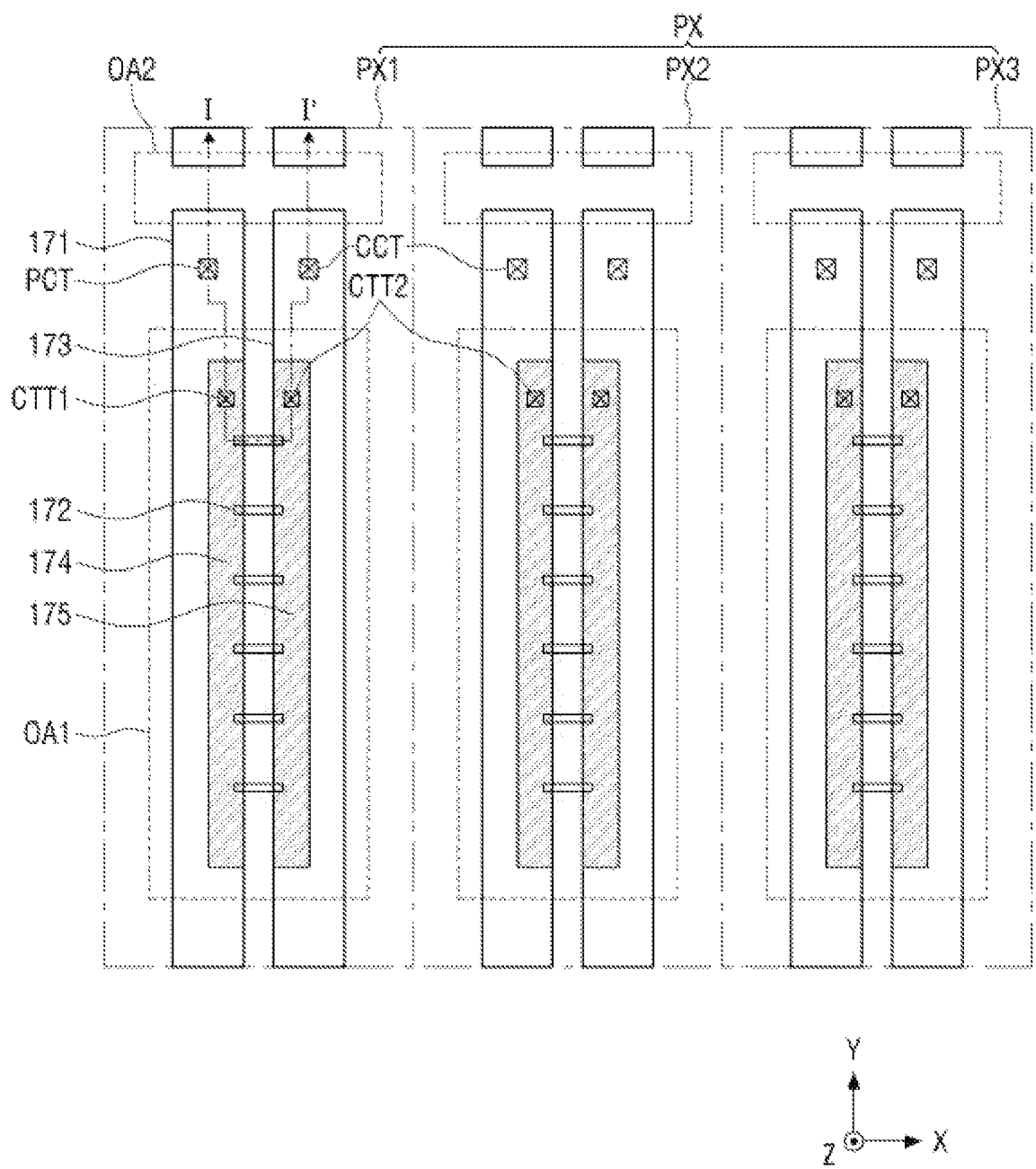
FIG. 3 is a schematic layout view of a pixel of FIG. 2.

FIG. 3 is a schematic layout view of a pixel of FIG. 2.

Referring to FIG. 3, a pixel PX may include subpixels (PX1, PX2, and PX3). The pixel PX is illustrated as including three subpixels (PX1, PX2, and PX3), for example, first, second, and third subpixels PX1, PX2, and PX3, but the disclosure is not limited thereto.

The first subpixel PX1 is a minimal unit for emitting light of a first color, the second subpixel PX2 is a minimal unit for emitting light of a second color, and the third subpixel PX3 is a minimal unit for emitting light of a third color. The first, second, and third colors may be red, green, and blue, respectively, but the disclosure is not limited thereto. In one example, first-color light may be red light having a central wavelength in a range of about 600 nm to about 750 nm, second-color light may be green light having a central wavelength in a range of about 480 nm to about 560 nm, and third-color light may be blue light having a central wavelength in a range of about 370 nm to about 490 nm.

Each of the first, second, and third subpixels PX1, PX2, and PX3 may include a first electrode 171, light-emitting elements 172, a second electrode 173, a first contact electrode 174, and a second contact electrode 175.

The first electrode 171 may be a pixel electrode that is separate between different subpixels (PX1, PX2, and PX3), and the second electrode 173 may be a common electrode that is separate between different subpixels (PX1, PX2, and PX3). In one example, the first electrode 171 may be an anode electrode electrically connected to first ends of the light-emitting elements 172, and the second electrode 173 may be a cathode electrode electrically connected to second ends of the light-emitting elements 172.

The first and second electrodes 171 and 173 may extend in the second direction (or the Y-axis direction). The first and second electrodes 171 and 173 may be disposed to be spaced apart from each other and may be electrically isolated from each other.

The first electrode 171 may be electrically connected to the source or drain electrode of a thin-film transistor (TFT) "ST" (of FIG. 5) through a pixel contact hole PCT. The second electrode 173 may be electrically connected to a first power line VL1 (of FIG. 5) through a common contact hole CCT.

FIG. 3 illustrates that each of the first, second, and third subpixels PX1, PX2, and PX3 may include one first electrode 171 and one second electrode 173, but the disclosure is not limited thereto. As an example, each of the first, second, and third subpixels PX1, PX2, and PX3 may include two or more first electrodes 171 and two or more second electrodes 173. As an example, each of the first, second, and third subpixels PX1, PX2, and PX3 may include two first electrodes 171 and one second electrode 173.

The first and second contact electrodes 174 and 175 may extend in the second direction (or the Y-axis direction). The length, in the second direction (or the Y-axis direction), of the first contact electrode 174 may be smaller than the length, in the second direction (or the Y-axis direction), of the first electrode 171. The length, in the second direction (or the Y-axis direction), of the second contact electrode 175 may be smaller than the length, in the second direction (or the Y-axis direction), of the second electrode 173. The width, in the first direction (or the X-axis direction), of the first contact electrode 174 may be smaller than the width, in the second direction (or the Y-axis direction), of the first electrode 171. The width, in the first direction (or the X-axis direction), of the second contact electrode 175 may be smaller than the width, in the first direction (or the X-axis direction), of the second electrode 173.

The first contact electrode 174 may overlap the first electrode 171 in a third direction (or a Z-axis direction). The first contact electrode 174 may be electrically connected to the first electrode 171 through a first contact hole CTT1.

The second contact electrode 175 may overlap the second electrode 173 in the third direction (or the Z-axis direction). The second contact electrode 175 may be electrically connected to the second electrode 173 through a second contact hole CTT2.

The first contact electrode 174 may contact the first ends of the light-emitting elements 172. The second contact electrode 175 may contact the second ends of the light-emitting elements 172. Accordingly, the light-emitting elements 172 may be electrically connected to the first electrode 171 via the first contact electrode 174 and to the second electrode 174 via the second contact electrode 175.

The light-emitting elements 172 may be disposed to be spaced apart from one another. The light-emitting elements 172 may extend in the first direction (or the X-axis direction) and may be arranged or disposed along the second direction (or the Y-axis direction).

Figure 5:
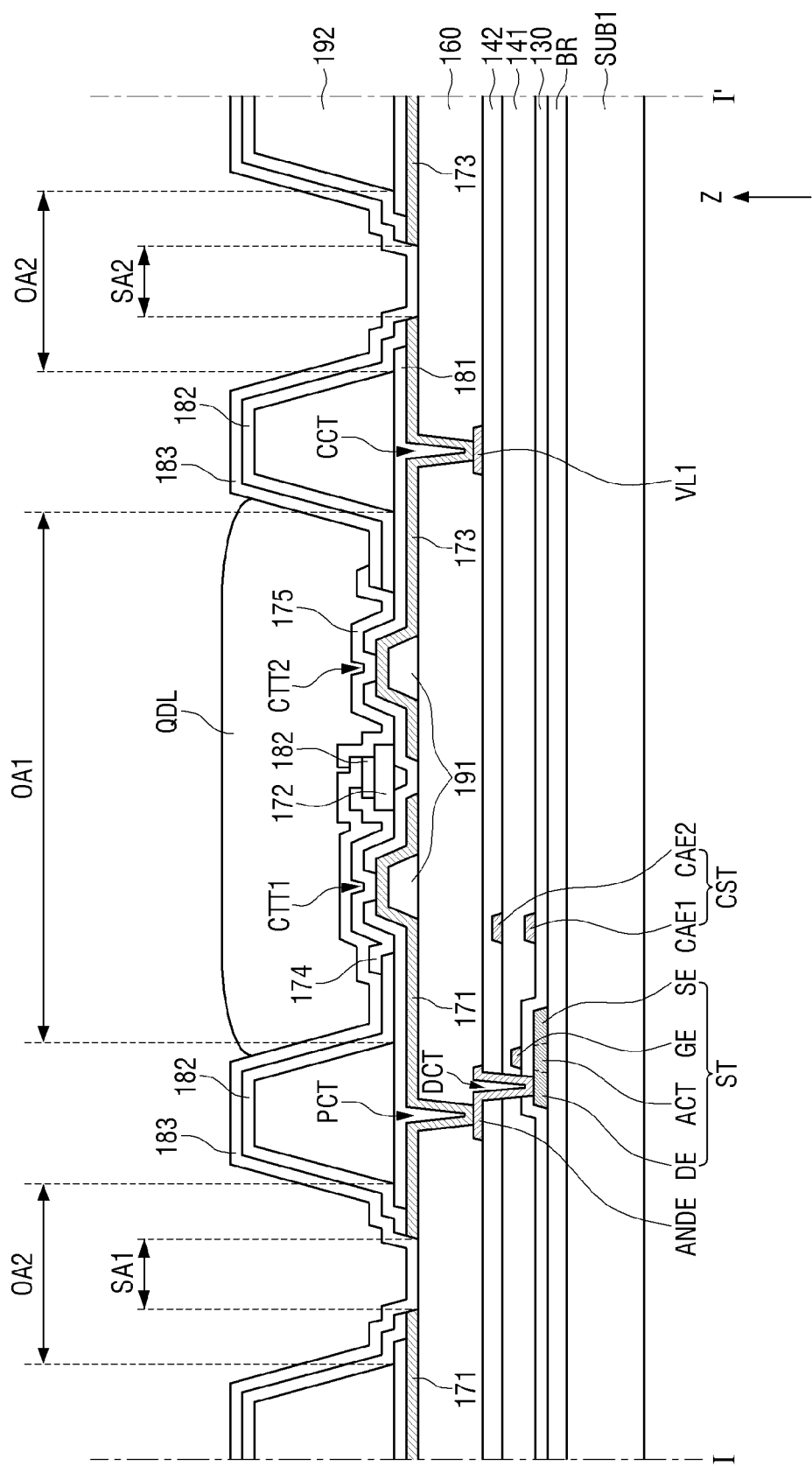
FIG. 5 is a schematic cross-sectional view taken along line I-I' of FIG. 3.

The light-emitting elements 172 may be disposed in a first opening OA1, which is defined by an external bank 192 (of FIG. 5). For example, the light-emitting elements 172 may not overlap the external bank 192 in the third direction (or the Z-axis direction).

The first ends of the light-emitting elements 172 may contact the first contact electrode 174, and the second ends of the light-emitting elements 172 may contact the second contact electrode 175. The first ends of the light-emitting elements 172 may overlap the first electrode 171 in the third direction (or the Z-axis direction), and the second ends of the light-emitting elements 172 may overlap the second electrode 173 in the third direction (or the Z-axis direction).

The light-emitting elements 172 may have a rod, wire, or tube shape. In one example, the light-emitting elements 172 may be formed as cylinders or rods. In another example, the light-emitting elements 172 may be formed as polyhedrons such as regular cubes or rectangular parallelepipeds or as polygonal columns such as hexagonal columns. In another example, the light-emitting elements 172 may be formed as truncated cones that extend in a direction and partially have inclined outer surfaces. The light-emitting elements 172 may have a length in a range of about 1 μm to about 10 μm or in a range of about 2 μm to about 6 μm, or, as an example, in a range of about 3 μm to about 5 μm. The light-emitting elements 172 may have a diameter in a range of about 300 nm to about 700 nm and an aspect ratio in a range of about 1.2 to about 100.

The external bank 192 may define the first opening OA1 and a second opening OA2 in each of the first, second, and third subpixels PX1, PX2, and PX3. The first opening OA1 may be an emission area where the light-emitting elements 172 are disposed. The second opening OA2 may be a separation area where the first and second electrodes 171 and 173 are separated. In the second opening OA2, two first electrodes 171 of two adjacent subpixels in the second direction (or the Y-axis direction) may be spaced apart from each other, and two second electrodes 172 of the two adjacent subpixels in the second direction (or the Y-axis direction) may be spaced apart from each other. The minimum distance, in the second direction (or the Y-axis direction), between the two first electrodes 171 may be smaller than the maximum length, in the second direction (or the Y-axis direction), of the second opening OA2. The minimum distance, in the second direction (or the Y-axis direction), between the two second electrodes 173 may be smaller than the maximum length, in the second direction (or the Y-axis direction), of the second opening OA2.

FIG. 3 illustrates that the first and second openings OA1 and OA2 are spaced apart from each other, but the disclosure is not limited thereto. As an example, the first and second openings OA1 and OA2 may be integral with each other as a single opening.

Figure 4:
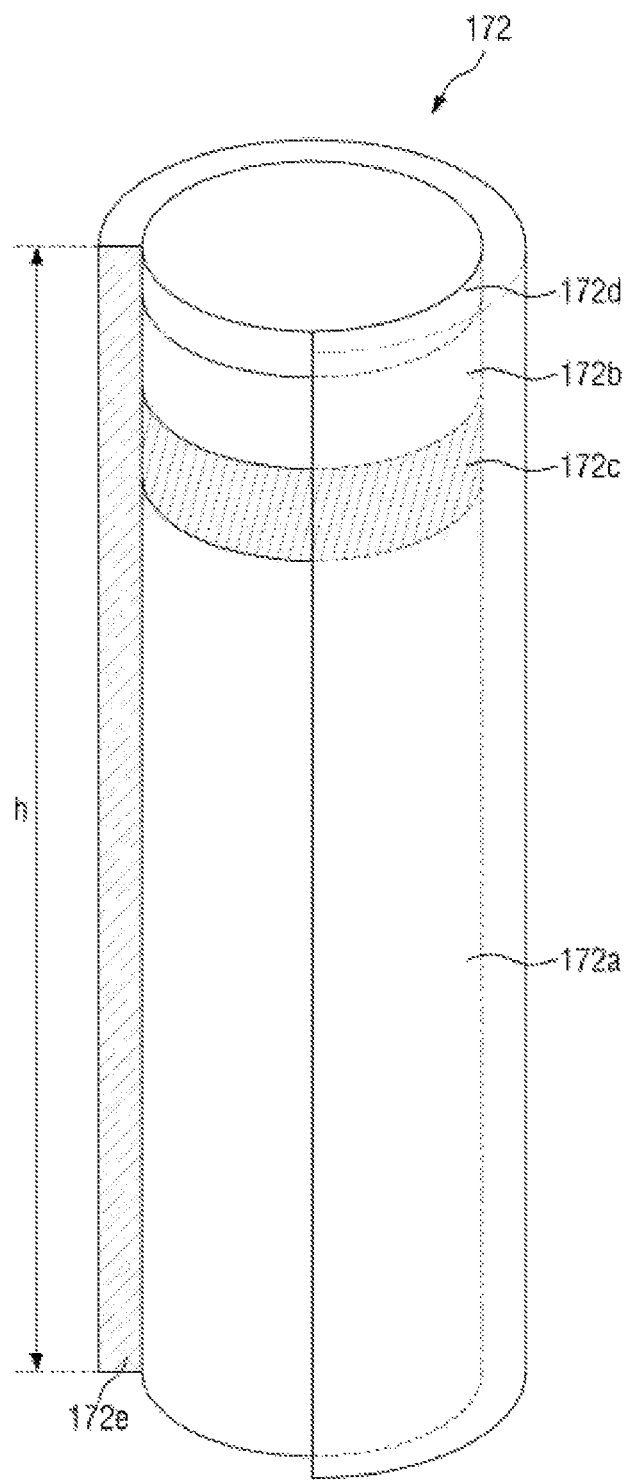
FIG. 4 is a schematic perspective view of a light-emitting element of FIG. 3.

FIG. 4 is a schematic perspective view of a light-emitting element of FIG. 3.

Referring to FIG. 4, a light-emitting element 172 may include a first semiconductor layer 172a, a second semiconductor layer 172b, an active layer 172c, an electrode layer 172d, and an insulating film 172e.

The light-emitting element 172 may extend in a direction. The light-emitting element 172 may have a rod, wire, or tube shape. In one example, the light-emitting element 172 may be formed as a cylinder or a rod. However, the shape of the light-emitting element 172 is not particularly limited. As an example, the light-emitting element 172 may be formed in various other shapes such as a substantially polygonal column such as a substantially regular cube, a substantially rectangular parallelopiped, or a substantially hexagonal column or as a substantially truncated cone that extends in a direction and partially has an inclined outer surface.

The light-emitting element 172 may include semiconductor layers that are doped with impurities of an arbitrary conductivity type (for example, a p type or an n type). The semiconductor layers may receive an electrical signal applied thereto from an external power source and may thus emit light of a particular wavelength range. Multiple semiconductors included in the light-emitting element 172 may be sequentially arranged or disposed or stacked in a direction.

The light-emitting element 172 may include the first semiconductor layer 172a, the second semiconductor layer 172b, the active layer 172c, the electrode layer 172d, and the insulating film 172e. For convenience, FIG. 4 illustrates the first semiconductor layer 172a, the second semiconductor layer 172b, the active layer 172c, and the electrode layer 172d as being exposed due to a portion of the insulating film 172e being removed, and the insulating film 172e may be disposed to surround the outer surfaces of the first semiconductor layer 172a, the second semiconductor layer 172b, the active layer 172c, and the electrode layer 172d.

The first semiconductor layer 172a may be an n-type semiconductor. In one example, in a case where the light-emitting element 172 emits blue-wavelength light, the first semiconductor layer 172a may include a semiconductor material, for example, $Al_xGa_yIn_{1-x-y}N$ (where $0 \leq x \leq 1$, $0 \leq y \leq 1$, and $0 \leq x+y \leq 1$). The semiconductor material may be, for example, at least one of AlGaInN, GaN, AlGaN, InGaN, AlN, and InN that are doped with an n-type dopant. The first semiconductor layer 172a may be doped with an n-type dopant, and the n-type dopant may be, for example, Si, Ge, or Sn. In one example, the first semiconductor layer 172a may be n-GaN doped with n-type Si. The first semiconductor layer 172a may have a length in a range about of 1.5 μm to about 5 μm, but the disclosure is not limited thereto.

The second semiconductor layer 172b is disposed on the active layer 172c. The second semiconductor layer 172b may be a p-type semiconductor. In one example, in a case where the light-emitting element 172 emits blue- or green-wavelength light, the second semiconductor layer 172b may include a semiconductor material, for example, $Al_xGa_yIn_{1-x-y}N$ (where $0 \leq x \leq 1$, $0 \leq y \leq 1$, and $0 \leq x+y \leq 1$). The semiconductor material may be, for example, at least one of AlGaInN, GaN, AlGaN, InGaN, AlN, and InN that are doped with a p-type dopant. The second semiconductor layer 172b may be doped with a p-type dopant, and the p-type dopant may be, for example, Mg, Zn, Ca, Se, or Ba. In one example, the second semiconductor layer 172b may be p-GaN doped with n-type Mg. The second semiconductor layer 172b may have a length in a range of about 0.05 μm to about 0.10 μm, but the disclosure is not limited thereto.

FIG. 4 illustrates that the first and second semiconductor layers 172a and 172b are single layers, but the disclosure is not limited thereto. As an example, each of the first and second semiconductor layers 172a and 172b may include more than one layer depending on the material of the active layer 172c. In one example, each of the first and second semiconductor layers 172a and 172b may further include a clad layer or a tensile strain barrier reducing (TSBR) layer.

The active layer 172c may be disposed between the first and second semiconductor layers 172a and 172b. The active layer 172c may include a single- or multi-quantum well structure material. In a case where the active layer 172c may include a material having a multi-quantum well structure, the active layer 172c may have a structure in which multiple quantum layers and multiple well layers may be alternately stacked each other. The active layer 172c may emit light by combining electron-hole pairs in accordance with electrical signals applied thereto via the first and second semiconductor layers 172a and 172b. In one example, in a case where the light-emitting element 172 emits blue-wavelength light, the active layer 172c may include a material such as AlGaN or AlGaInN. In case that the active layer 172c has a multi-quantum well structure in which multiple quantum layers and multiple well layers may be alternately stacked each other, the quantum layers may include a material such as AlGaN or AlGaInN, and the well layers may include a material such as GaN or AlInN. In one example, the active layer 172c may include AlGaInN as its quantum layer and AlInN as its well layer and may thus be able to emit blue light having a central wavelength in a range of about 370 nm to about 490 nm.

As an example, the active layer 172c may have a structure in which a semiconductor material having a large band gap energy and a semiconductor material having a small band gap energy may be alternately stacked or may include group-III or group-V semiconductor materials depending on the wavelength of light to be emitted. The type of light emitted by the active layer 172c is not particularly limited. The active layer 172c may emit red- and green-wavelength light as necessary, instead of blue-wavelength light. The active layer 172c may have a length in a range of about 0.05 µm to about 0.10 µm, but the disclosure is not limited thereto.

Light may be emitted from the active layer 172c not only through the outer surface of the light-emitting element 172 along a lengthwise direction, but also through both sides of the light-emitting element 172. The directivity of light emitted from the active layer 172c is not particularly limited.

The electrode layer 172d may be an ohmic contact electrode, but the disclosure is not limited thereto. As an example, the electrode layer 172d may be a Schottky contact electrode. The light-emitting element 172 may include at least one electrode layer 172d. The light-emitting element 172 may include more than one electrode layer 172d, but the disclosure is not limited thereto. As an example, the electrode layer 172d may not be provided.

The electrode layer 172d may reduce the resistance between the light-emitting element 172 and the first contact electrode 174 in case that the first end of the light-emitting element 172 is placed in contact with the first contact electrode 174. The electrode layer 172d may include a conductive metal. In one example, the electrode layer 172d may include at least one of aluminum (Al), titanium (Ti), indium (In), gold (Au), silver (Ag), indium tin oxide (ITO), indium zinc oxide (IZO), and indium tin zinc oxide (ITZO). In another example, the electrode layer 172d may include a semiconductor material doped with an n- or p-type dopant.

The electrode layer 172d may have a length in a range of about 0.05 µm to about 0.10 µm, but the disclosure is not limited thereto.

The insulating film 172e may be disposed to surround the outer surfaces of the first semiconductor layer 172a, the second semiconductor layer 172b, the active layer 172c, and the electrode layer 172d. The insulating film 172e may protect the first semiconductor layer 172a, the second semiconductor layer 172b, the active layer 172c, and the electrode layer 172d. In one example, the insulating film 172e may be formed to expose both end portions, in a length direction, of the light-emitting element 172.

FIG. 4 illustrates that the insulating film 172e extends in the length direction of the light-emitting element 172 to cover or overlap the light-emitting element 172, ranging from the first semiconductor layer 172a to the electrode layer 172d, but the disclosure is not limited thereto. As an example, the insulating film 172e may cover or overlap only the outer surface of the active layer 172c and portions of the outer surfaces of the first and second semiconductor layers 172a and 172b. As an example, the insulating film 172e may cover or overlap only a portion of the outer surface of the electrode layer 172d, and as a result, a portion of the outer surface of the electrode layer 172d may not be covered or overlapped by the insulating film 172e, but partially exposed.

The insulating film 172e may have a thickness in a range of about 10 nm to about 1.0 µm, but the disclosure is not limited thereto. The insulating film 172e may have a thickness of about 40 nm.

The insulating film 172e may include a material with an insulating property such as, for example, silicon oxide ($SiO_x$), silicon nitride ($SiN_x$), silicon oxynitride ($SiO_xN_y$), aluminum nitride (AlN), or aluminum oxide ($Al_2O_3$). Accordingly, the insulating film 172e can prevent a short circuit that may occur in case that the active layer 172c is placed in direct contact with the first or second contact electrode 174 or 175. As the insulating film 172e may include the active layer 172c and thereby protects the outer surface of the light-emitting element 172c, any decrease in emission efficiency can be prevented.

The light-emitting element 172 may be included in a coating solution during the fabrication of the display device 10. The surface of the insulating film 172e may be hydrophobically or hydrophilically treated to properly separate the light-emitting element 172 from other light-emitting elements 172 in the coating solution without coagulation.

The light-emitting element 172 may have a length h in a range of about 1 µm to about 10 µm or in a range of about 2 µm to about 6 µm, or, as an example, in a range of about 3 µm to about 5 µm. The light-emitting element 172 may have a diameter in a range of about 300 nm to about 700 nm and an aspect ratio in a range of about 1.2 to about 100. The diameter of the light-emitting element 172 may vary depending on the composition of the active layer 172c. The light-emitting element 172 may have a diameter of about 500 nm.

FIG. 5 is a schematic cross-sectional view taken along line I-I' of FIG. 3.

Referring to FIG. 5, the first subpixel PX1 may include at least one TFT "ST", at least one capacitor CST, a first electrode 171, light-emitting elements 172, a second electrode 173, a first contact electrode 174, a second contact electrode 175, and a first wavelength conversion layer QDL.

The substrate SUB1 may be formed of an insulating material such as glass, quartz, or a polymer resin. The substrate SUB1 may be a rigid substrate or a flexible substrate that is bendable, foldable, or rollable.

A barrier film BR may be disposed on the substrate SUB1. The barrier film BR may be a film for protecting the TFT "ST" from moisture that may penetrate into the first substrate SUB1, which is susceptible to moisture. The barrier film BR may include inorganic films that may be alternately stacked each other. In one example, the barrier film BR may be formed as a multifilm in which inorganic films including at least one of $SiO_x$, $SiN_x$, and $SiO_xN_y$ may be alternately stacked each other.

A semiconductor layer including an active layer ACT, a source electrode SE, and a drain electrode DE of the TFT "ST" may be disposed on the barrier film BR. The semiconductor layer may include polycrystalline silicon, monocrystalline silicon, low-temperature polycrystalline silicon, amorphous silicon, or an oxide semiconductor. The source electrode SE and the drain electrode DE may be formed of a silicon or oxide semiconductor doped with ions or impurities and may thus have conductivity. The active layer ACT may overlap a gate electrode GE of the TFT "ST" in the thickness direction of the substrate SUB1, for example, in the third direction (or the Z-axis direction), but the source electrode SE and the drain electrode DE may not overlap the gate electrode GE in the third direction (or the Z-axis direction).

A gate insulating film 130 may be disposed on the active layer ACT, the source electrode SE, and the drain electrode DE. The gate insulating film 130 may include an inorganic film such as, for example, a film of $SiO_x$, $SiN_x$, or $SiO_xN_y$.

A first gate conductive layer including the gate electrode GE of the TFT "ST" and a first capacitor electrode CAE1 of the capacitor CST may be disposed on the gate insulating film 130. The gate electrode GE may overlap the active layer ACT in the third direction (or the Z-axis direction). The first gate conductive layer may be formed as a single layer or a multilayer including at least one of molybdenum (Mo), Al, chromium (Cr), Au, Ti, nickel (Ni), neodymium (Nd), copper (Cu), and an alloy thereof.

A first interlayer insulating film 141 may be disposed on the gate electrode GE and the first capacitor electrode CAE1. The first interlayer insulating film 141 may include an inorganic film such as, for example, a film of $SiO_x$, $SiN_x$, or $SiO_xN_y$.

A second gate conductive layer including a second capacitor electrode CAE2 of the capacitor CST may be disposed on the first interlayer insulating film 141. As the first interlayer insulating film 141 has a dielectric constant, the capacitor CST may be formed by the first capacitor electrode CAE1, the second capacitor electrode CAE2, and the first interlayer insulating film 141. The second capacitor electrode CAE2 may be formed as a single layer or a multilayer including at least one of Mo, Al, Cr, Au, Ti, Ni, Nd, Cu, and an alloy thereof.

A second interlayer insulating film 142 may be disposed on the second capacitor electrode CAE2. The second interlayer insulating film 142 may include an inorganic film such as, for example, a film of $SiO_x$, $SiN_x$, or $SiO_xN_y$.

A data conductive layer including a connecting electrode ANDE and the first power line VL1 may be disposed on the second interlayer insulating film 142. The connecting electrode ANDE may be electrically connected to the drain electrode DE through a drain contact hole DCT, which penetrates the gate insulating film 130, the first interlayer insulating film 141, and the second interlayer insulating film 142 and thereby exposes the drain electrode DE of the TFT "ST". FIG. 4 illustrates that the connecting electrode ANDE is electrically connected to the drain electrode DE of the TFT "ST", but the disclosure is not limited thereto. As an example, the connecting electrode ANDE may be electrically connected to the source electrode SE through a source contact hole, which penetrates the gate insulating film 130, the first interlayer insulating film 141, and the second interlayer insulating film 142 and thereby exposes the source electrode SE of the TFT "ST". A first power supply voltage may be applied to the first power line VL1. The first power supply line VL1 may extend in the first direction (or the X-axis direction), but the disclosure is not limited thereto. The data conductive layer may be formed as a single layer or a multilayer including at least one of Mo, Al, Cr, Au, Ti, Ni, Nd, Cu, and an alloy thereof.

A planarization film 160, which is for planarizing a height difference formed by the thin-film transistor ST, may be disposed on the connecting electrode ANDE. The planarization film 160 may be formed as an organic film including a photosensitive resin such as an acrylic resin, an epoxy resin, a phenolic resin, a polyamide resin, or a polyimide resin.

The first electrode 171, the second electrode 173, and internal banks 191 may be disposed on the planarization film 160.

The internal banks 191 may be disposed in a first opening OA1 defined by the external bank 192. The light-emitting elements 172 may be disposed between a pair of adjacent internal banks 181. Each of the internal banks 191 may have a bottom surface contacting the planarization film 160, a top surface that is opposite to the bottom surface, and side surfaces that are between the top and bottom surfaces. The internal banks 191 may have a substantially trapezoidal shape in a cross-sectional view, but the disclosure is not limited thereto.

The internal banks 191 may be formed as organic films including a photosensitive resin such as an acrylic resin, an epoxy resin, a phenolic resin, a polyamide resin, or a polyimide resin. In one example, the internal banks 191 may be formed of a photoresist resin such as a positive or negative photoresist resin.

The first electrode 171 may be disposed on the planarization film 160 and the internal banks 191. The first electrode 171 may be disposed on at least a side surface and the top surface of each of the internal banks 191. The first electrode 171 may be electrically connected to the connecting electrode ANDE through a pixel contact hole PCT, which penetrates the planarization film 160. Accordingly, the first electrode 171 may be electrically connected to the drain electrode DE of the TFT "ST". The pixel contact hole PCT may overlap the external bank 192 in the third direction (or the Z-axis direction). The pixel contact hole PCT may be disposed between the first opening OA1 and a second opening OA2.

The second electrode 173 may be disposed on the planarization film 160 and the internal banks 191. The second electrode 173 may be disposed on at least a side surface and the top surface of each of the internal banks 191. The second electrode 173 may be electrically connected to the first power line VL1 through a common contact hole CCT, which penetrates the planarization film 160. The common contact hole CCT may overlap the external bank 192 in the third direction (or the Z-axis direction). The common contact hole CCT may be disposed between the first and second openings OA1 and OA2.

The first and second electrodes 171 and 173 may include a conductive material with high reflectance. In one example, the first and second electrodes 171 and 173 may include a metal such as Ag, Cu, or Al. Accordingly, light emitted from the light-emitting elements 172 to travel toward the first and second electrodes 171 and 173 may be reflected by the first and second electrodes 171 and 173 and may thereby travel beyond the tops of the light-emitting elements 172.

A first insulating film 181 may be disposed on the first and second electrodes 171 and 173. The first insulating film 181 may be disposed on portions of the planarization film 160 not covered or overlapped, but exposed, by the first and second electrodes 171 and 173. The first insulating film 181 may include an inorganic film such as, for example, a film of $SiO_x$, $SiN_x$, or $SiO_xN_y$.

The external bank 192 may be disposed on the first insulating film 181. The external bank 192 may define the first and second openings OA1 and OA2. The external bank 192 may not overlap the internal banks 191. The external bank 192 may have a bottom surface contacting the first insulating film 181, a top surface that is opposite to the bottom surface, and side surfaces that are between the top and bottom surfaces. The external bank 192 may have a substantially trapezoidal shape in a cross-sectional view, but the disclosure is not limited thereto.

The external bank 192 may be formed as an organic film including a photosensitive resin such as an acrylic resin, an epoxy resin, a phenolic resin, a polyamide resin, or a polyimide resin. In one example, the external bank 192 may be formed of a photoresist resin such as a positive or negative photoresist resin.

The light-emitting elements 172 may be disposed on the first insulating film 181. A second insulating film 182 may be disposed on the light-emitting elements 172. The second insulating film 182 may be disposed on the external bank 192. The second insulating film 182 may be disposed on portions of the first and second electrodes 171 and 173 not covered or overlapped, but exposed, by the first insulating film 181, in the second opening OA2. The second insulating film 182 may include an inorganic film such as, for example, a film of $SiO_x$, $SiN_x$, or $SiO_xN_y$.

The first contact electrode 174 may be electrically connected to the first electrode 171 through a first contact hole CTT1, which penetrates the first insulating film 181. The first contact hole CTT1 may overlap one of the internal banks 191 in the third direction (or the Z-axis direction). The first contact electrode 174 may contact the first ends of the light-emitting elements 172. Accordingly, the first ends of the light-emitting elements 172 may be electrically connected to the first electrode 171 via the first contact electrode 174. The first contact electrode 174 may be disposed on the second insulating film 182.

A third insulating film 183 may be disposed on the first contact electrode 174. The third insulating film 183 may be disposed to cover or overlap the first contact electrode 174 to electrically isolate the first and second contact electrodes 174 and 175. The third insulating film 183 may also cover or overlap portions of the second insulating film 182 on the external bank 192. The third insulating film 183 may be disposed in separation areas SA1 and SA2 of the first and second electrodes 171 and 173, in the second opening OA2. For example, the third insulating film 183 may be disposed on portions of the planarization film 160, not covered or overlapped, but exposed, by the first and second electrodes 171 and 173, but in the second opening OA2. The third insulating film 183 may include an inorganic film such as, for example, a film of $SiO_x$, $SiN_x$, or $SiO_xN_y$.

The second contact electrode 175 may be electrically connected to the second electrode 173 through a second contact hole CTT2, which penetrates the first insulating film 181. The second contact hole CTT2 may overlap one of the internal banks 191 in the third direction (or the Z-axis direction). The second contact electrode 175 may contact the second ends of the light-emitting elements 172. Accordingly, the second ends of the light-emitting elements 172 may be electrically connected to the second electrode 173 via the second contact electrode 175. The second contact electrode 175 may be disposed on the third insulating film 183.

The first and second contact electrodes 174 and 175 may be formed of a transparent conductive oxide (TCO) capable of transmitting light therethrough, such as ITO or IZO. Accordingly, light emitted from the light-emitting elements 172 can be prevented from being blocked by the first and second contact electrodes 174 and 175.

The first ends of the light-emitting elements 172 may be electrically connected to the drain electrode DE of the TFT "ST" via the first contact electrode 174 and the first electrode 171, and the second ends of the light-emitting elements 172 may be electrically connected to the first power line VL1 through the second contact electrode 175 and the second electrode 173. Accordingly, the light-emitting elements 172 may emit light in accordance with a current that flows from the first ends to the second ends thereof.

The first wavelength conversion layer QDL may be disposed in the first subpixel PX1, a second wavelength conversion layer may be disposed in the second subpixel PX2, and a transparent insulating film may be disposed in the third subpixel PX3. The light-emitting elements 172 of each of the first, second, and third subpixels PX1, PX2, and PX3 may emit third-color light. The third-color light may be short-wavelength light such as blue light or ultraviolet (UV) light having a central wavelength in a range of about 370 nm to about 490 nm.

The first wavelength conversion layer QDL may convert the third-color light emitted from the light-emitting elements 172 into first-color light. The first-color light may be red light having a central wavelength in a range of about 600 nm to about 750 nm.

The second wavelength conversion layer may convert the third-color light emitted from the light-emitting elements 172 of the second subpixel PX2 into second-color light. The second-color light may be green light having a central wavelength in a range of about 480 nm to about 560 nm.

Each of the first wavelength conversion layer QDL and the second wavelength conversion layer may include a base resin, a wavelength shifter, and a scatterer.

The base resin may include a material having high light transmittance and having excellent dispersion properties for the wavelength shifter and the scatterer. In one example, the base resin may include an organic material such as an epoxy resin, an acrylic resin, a cardo resin, or an imide resin.

The wavelength shifter may convert or shift the wavelength of incident light. The wavelength shifter may be quantum dots, quantum rods, or a phosphor. The size of the quantum dots of the first wavelength conversion layer QDL may differ from the size of the quantum dots of the second wavelength conversion layer.

The scatterer may scatter incident light in random directions without substantially changing the wavelength of the incident light passing through the first wavelength conversion layer QDL or the second wavelength conversion layer. In this manner, the path of light passing through the first wavelength conversion layer QDL or the second wavelength conversion layer can be lengthened, and as a result, the color conversion efficiency of the wavelength shifter can be enhanced. The scatterer may include light-scattering particles. The scatterer may include particles of a metal oxide such as, for example, titanium oxide ($TiO_2$), silicon oxide ($SiO_2$), zirconium oxide ($ZrO_2$), aluminum oxide ($Al_2O_3$), indium oxide ($In_2O_3$), zinc oxide (ZnO), or tin oxide ($SnO_2$). As an example, the scatterer may include organic particles such as, for example, particles of an acrylic resin or a urethane resin.

The transparent insulating film may transmit short-wavelength light such as blue light or UV light therethrough as it is. The transparent insulating film may be formed as an organic film with high transmittance.

The first wavelength conversion layer QDL may be disposed on the second contact electrode 175 and the third insulating film 183, in the first subpixel PX1. The arrangement of the second wavelength conversion layer in the second subpixel PX2 and the arrangement of the transparent insulating film in the third subpixel PX3 may be substantially the same as the arrangement of the first wavelength conversion layer QDL in the first subpixel PX1, and thus, detailed descriptions thereof will be omitted.

A first color filter may be disposed on the first wavelength conversion layer QDL. The first color filter may transmit first-color light, for example, red-wavelength light, therethrough. Thus, short-wavelength light that fails to be converted into first-color light after emitted from the light-emitting elements 172 of the first subpixel PX1 may not pass through the first color filter. On the contrary, short-wavelength light that is converted into first-color light by the first wavelength conversion layer QDL may pass through the first color filter.

A second color filter may be disposed on the second wavelength conversion layer. The second color filter may transmit second-color light, for example, green-wavelength light, therethrough. Thus, short-wavelength light that fails to be converted into second-color light after emitted from the light-emitting elements 172 of the second subpixel PX2 may not pass through the second color filter. On the contrary, short-wavelength light that is converted into second-color light by the second wavelength conversion layer may pass through the second color filter.

A third color filter may be disposed on the transparent insulating film. The third color filter may transmit third-color light, for example, blue-wavelength light, therethrough. Thus, short-wavelength light emitted from the light-emitting elements 172 of the third subpixel PX3 may pass through the third color filter.

A black matrix may be disposed on the first, second, and third color filters. The black matrix may also be disposed between the first, second, and third color filters. The black matrix may include a light-blocking material capable of blocking the transmission of light. The black matrix may include an inorganic black pigment such as carbon black or an organic black pigment.

The second and third subpixels PX2 and PX3 may be substantially the same as the first subpixel PX1, except for the first wavelength conversion layer QDL and the first color filter, and thus, detailed descriptions thereof will be omitted.

Figure 7:
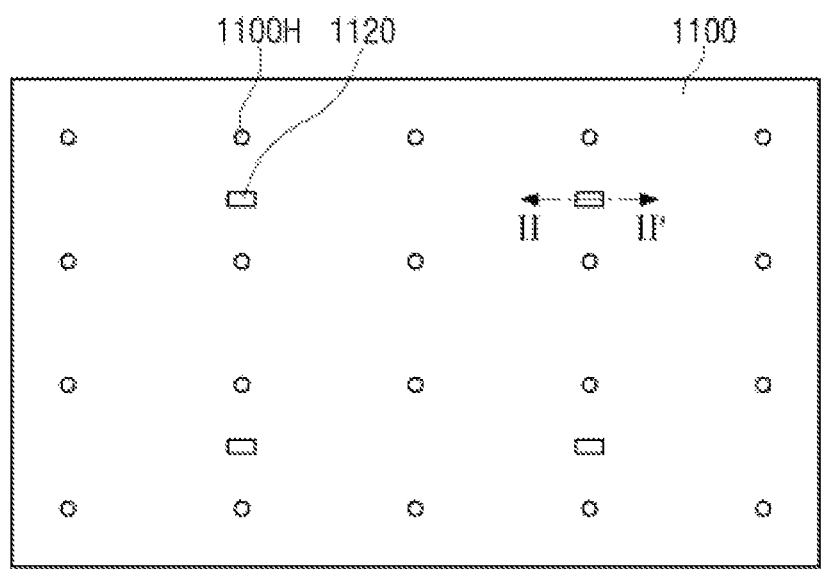
FIG. 7 is a schematic plan view of a stage of FIG. 6.
Figure 8:
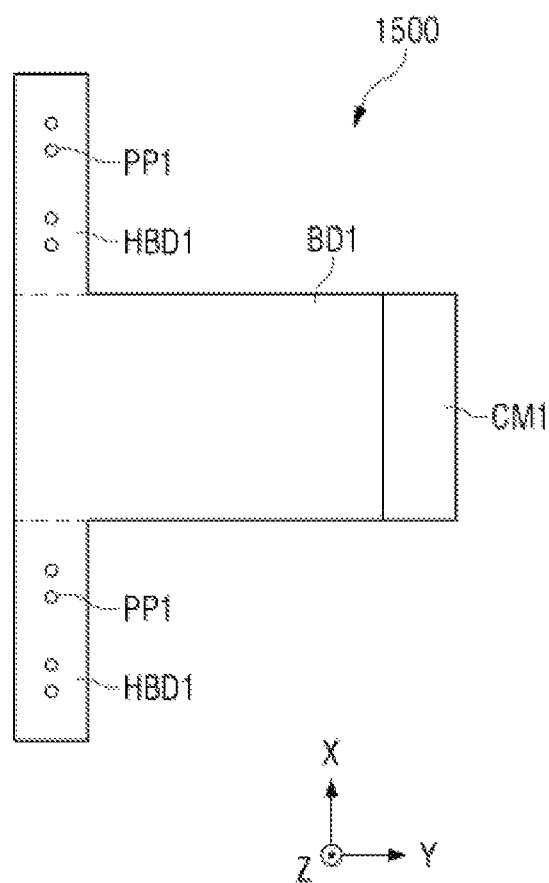
FIG. 8 is a bottom view of a first electric field applying module of FIG. 6.
Figure 9:
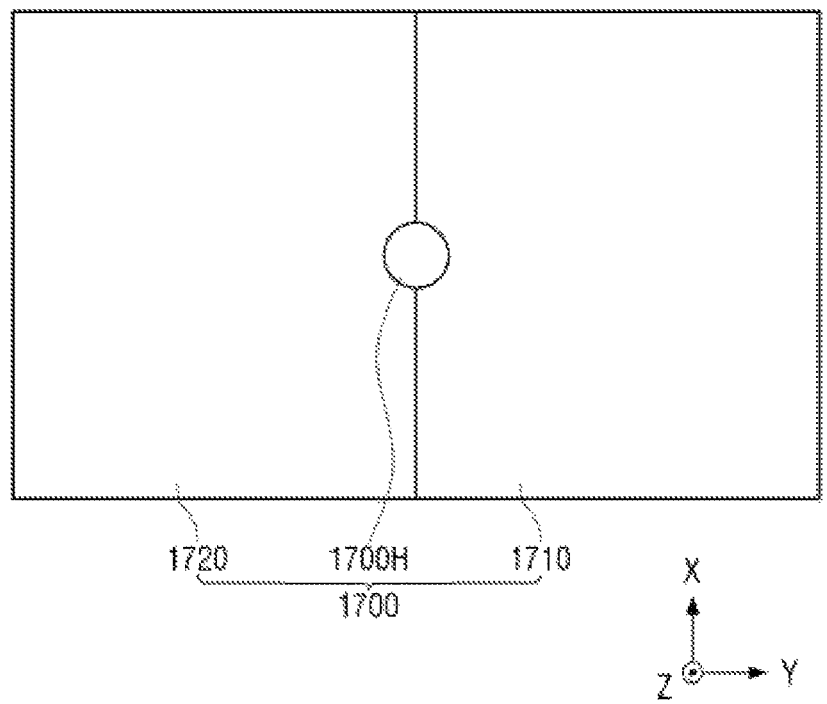
FIG. 9 is a bottom view of a light irradiation module of FIG. 6.

FIG. 6 is a side view of an apparatus for manufacturing a display device according to an embodiment. FIG. 7 is a plan view of a stage of FIG. 6. FIG. 8 is a bottom view of a first electric field applying module of FIG. 6. FIG. 9 is a bottom view of a light irradiation module of FIG. 6.

FIGS. 6 through 9 illustrate an apparatus 1000 for manufacturing a display device, and the apparatus 1000 applies alignment signals for aligning light-emitting elements in each subpixel in each of display panel cells CEL1 and CEL2 of a mother substrate MSUB.

Referring to FIGS. 6 through 9, the apparatus 1000 may include a stage 1100, a stage support 1110, a stage mover 1200, supporting pins 1300, pin supports 1310, a first voltage output module 1410, a second voltage output module 1420, a first electric field applying module 1500, a first module mover 1510, a second electric field applying module 1600, a second module mover 1520, a light irradiation module 1700, and an optical device 1800.

The stage 1100 may have a flat top surface so that the mother substrate MSUB can be stably mounted thereon. The stage 1100 may be lifted up or down by the stage mover 1200.

The stage 1100 may include stage holes 1100H and sensor devices 1120.

The stage holes 1100H may be holes that penetrate the stage 1100. The supporting pins 1300 and the pin supports 1310 may be disposed in the stage holes 1100H. For example, the stage holes 1100H may overlap the supporting pins 1300 and the pin supports 1310. The stage holes 1100H may be arranged or disposed in a first direction (or an X-axis direction) and a second direction (or a Y-axis direction).

The sensor devices 1120 may sense light from the light irradiation module 1700 and may sense the temperature of the stage 1100. FIG. 7 illustrates that four sensor devices 1120 are arranged or disposed on the stage 1100, but the disclosure is not limited thereto. The stage 1100 may be divided into four sections, for example, two sections in the first direction (or the X-axis direction) and two sections in the second direction (or the Y-axis direction), and one sensor device 1120 may be disposed in each of the four sections. The sensor devices 1120 will be described later with reference to FIGS. 12 and 13.

The stage mover 1200 may be coupled or connected to the bottom of the stage 1100. The stage mover 1200 may lift up or down or raise or lower the stage 1100 under the control of a controller 1900 (of FIG. 14). To this end, the stage mover 1200 may include a motor as a power source for moving the stage 1100.

The supporting pins 1300 may be pins that support the mother substrate MSUB in case that the mother substrate MSUB is injected into, or ejected from, the apparatus 1000. The supporting pins 1300 may be connected to the pin supports 1310, which are disposed below the stage 1100, through the stage holes 1100H of the stage 1100.

In case that the stage 1100 is lifted down by the stage mover 1200, the supporting pins 1300 may protrude from the top surface of the stage 1100. In case that the stage 1100 is lifted up by the stage mover 1200, the supporting pins 1300 may not protrude from the top surface of the stage 1100 because the supporting pins 1300 are disposed in the stage holes 1100H of the stage 1100. Thus, in case that the stage 1100 is lifted up by the stage mover 1200, the mother substrate MSUB may be seated on the top surface of the stage 1100.

The stage support 1110 may be disposed below the stage 1100 to support the stage 1100. The stage mover 1200 and the pin supports 1310 may be disposed on the stage support 1110. The stage support 1110 may have various shapes other than that illustrated in FIG. 6.

The first voltage output module 1410 may be disposed on a first side of the stage 1100. The first voltage output module 1410 may be electrically connected to the first electric field applying module 1500 and a first light irradiation unit 1710 of the light irradiation module 1700. The first voltage output module 1410 may receive first and second alignment signals from the controller 1900 and may generate a first emission driving signal based on the second alignment signal. The first voltage output module 1410 may output the first and second alignment signals to the first electric field applying module 1500 to align light-emitting elements 172 in a first display panel cell CEL1. The first voltage output module 1410 may output the first alignment driving signal to the first light irradiation unit 1710 to excite active layers 172c of the light-emitting elements 171 in the first display panel cell CEL1.

The second voltage output module 1420 may be disposed on a second side of the stage 1100. The second voltage output module 1420 may be electrically connected to the second electric field applying module 1600 and the second light irradiation unit 1720 of the light irradiation module 1700. The second voltage output module 1420 may receive the first and second alignment signals from the controller 1900 and may generate a second emission driving signal based on the second alignment signal. The second voltage output module 1420 may output the first and second alignment signals to the second electric field applying module 1600 to align light-emitting elements 172 in a second display panel cell CEL2. The second voltage output module 1420 may output the second alignment driving signal to the second light irradiation unit 1720 to excite active layers 172c of the light-emitting elements 171 in the second display panel cell CEL2.

The first electric field applying module 1500 may be disposed on the first side of the stage 1100. Here, the first side of the stage 1100 may be the left side of the stage 1100. The first electric field applying module 1500 may include first probe heads HBD1, first probe pins PP1, a first body BD1, and a first coupler CM1.

The first probe pins PP1 may be disposed on the bottom surface of each of the first probe heads HBD1. The first probe pins PP1 may be formed of a highly conductive material such as, for example, a metallic material. FIG. 8 illustrates that each of the first probe heads HBD1 may include four first probe pins PP1, but the disclosure is not limited thereto.

The first body BD1 may extend in the second direction (or the Y-axis direction). The first probe heads HBD1 may protrude from a second end of the first body BD1 in the first direction (or the X-axis direction). Here, the second side of the first body BD1 may be the right side of the first body BD1. One of the first probe heads HBD1 may protrude from the second end of the first body BD1 in a forward direction in the first direction (or the X-axis direction), and another one of the first probe heads HBD1 may protrude from the second end of the first body BD1 in a backward direction in the first direction (or the X-axis direction). FIG. 8 illustrates that the first body BD1 and the first probe heads HBD1 are integral with each other, but as an example, the first body BD1 may be formed as a separate element from the first probe heads HBD1.

The first coupler CM1 may extend in a third direction (or a Z-axis direction). The first coupler CM1 may protrude from a first end of the first body BD1 in the third direction (or the Z-axis direction). The first coupler CM1 may be disposed on the bottom surface of the first body BD1. The first coupler CM1 may be coupled or connected to the first body BD1. The first coupler CM1 may be coupled or connected to the first module mover 1510, which is disposed on a second side of the first coupler CM1. The first coupler CM1 may be lifted up or down by the first module mover 1510.

The first module mover 1510 may be coupled or connected to the second side of the stage 1100. The first module mover 1510 may lift up or down or raise or lower the first electric field applying module 1500 under the control of the controller 1900. To this end, the first module mover 1510 may include a motor as a power source for moving the first electric field applying module 1500.

In case that the first module mover 1510 is lifted down, the first probe pins PP1 may contact first alignment pads AP1 (of FIG. 10) and second alignment pads AP2 (of FIG. 10), which are connected to the first display panel cell CEL1 of the mother substrate MSUB. The first and second alignment signals may be applied to the first display panel cell CEL1 of the mother substrate MSUB via the first probe pins PP1. Thus, the light-emitting elements 172 in the first display panel cell CEL1 may be aligned in each of subpixels (PX1, PX2, and PX3) in the first display panel cell CEL1. In case that the first module mover 1510 is lifted up, the first probe pins PP1 may be spaced apart from the first alignment pads AP1 and the second alignment pads AP2 of the mother substrate MSUB. The first alignment pads AP1 and the second alignment pads AP2 of the mother substrate MSUB will be described later with reference to FIGS. 10 and 11.

The second electric field applying module 1600 may be disposed on the second side of the stage 1100, for example, on the left side of the stage 1100. The second side of the stage 1100 may be opposite to a first side of the stage 1100. The first and second electric field applying modules 1500 and 1600 may be disposed to face each other.

The second electric field applying module 1600 may include second probe heads HBD2, second probe pins PP2, a second body BD2, and a second coupler CM2.

The second probe pins PP2 may be disposed on the bottom surface of each of the second probe heads HBD2. The second probe pins PP2 may be formed of a highly conductive material such as, for example, a metallic material. FIG. 8 illustrates that each of the second probe pins PP2 may include four second probe pins PP2, but the disclosure is not limited thereto.

The second body BD2 may extend in the second direction (or the Y-axis direction). The second probe heads HBD2 may protrude from a first end of the second body BD2 in the first direction (or the X-axis direction). One of the second probe heads HBD2 may protrude from the first end of the second body BD2 in the forward direction in the first direction (or the X-axis direction), and another one of the second probe heads HBD2 maya protrude from the first end of the second body BD2 in the backward direction in the first direction (or the X-axis direction). In an embodiment of FIG. 8, the second body BD2 and the second probe heads HBD2 may be integral with each other, but as an example, the second body BD2 may be formed as a separate element from the second probe heads HBD2.

The second coupler CM2 may extend in the third direction (or the Z-axis direction). The second coupler CM2 may protrude from a second end of the second body BD1 in the third direction (or the Z-axis direction). The second coupler CM2 may be disposed on the bottom surface of the second body BD2. The second coupler CM2 may be coupled or connected to the second body BD2. The second coupler CM2 may be coupled or connected to the second module mover 1520, which is disposed on a first side of the second coupler CM2. The second coupler CM2 may be lifted up or down by the second module mover 1520.

The second module mover 1520 may be coupled or connected to the first side of the stage 1100. The second module mover 1520 may lift up or down or raise or lower the second electric field applying module 1600 under the control of the controller 1900. To this end, the second module mover

1520 may include a motor as a power source for moving the second electric field applying module 1600.

In case that the second module mover 1520 is lifted down, the second probe pins PP2 may contact third alignment pads AP3 (of FIG. 10) and fourth alignment pads AP4 (of FIG. 10), which are connected to the second display panel cell CEL2 of the mother substrate MSUB. The first and second alignment signals may be applied to the second display panel cell CEL2 of the mother substrate MSUB via the second probe pins PP2. Thus, the light-emitting elements 172 in the second display panel cell CEL2 may be aligned in each of subpixels (PX1, PX2, and PX3) in the second display panel cell CEL2. In case that the second module mover 1520 is lifted up, the second probe pins PP2 may be spaced apart from the third alignment pads AP3 and the fourth alignment pads AP4 of the mother substrate MSUB. The third alignment pads AP3 and the fourth alignment pads AP4 of the mother substrate MSUB will be described later with reference to FIGS. 10 and 11.

The light irradiation module 1700 may be disposed on the top surface of the stage 1100. The light irradiation module 1700 applies light onto the top surface of the stage 1100. The light irradiation module 1700 may be disposed to cover or overlap the entire top surface of the stage 1100 or the entire top surface of the mother substrate MSUB. In one example, the size of the light irradiation module 1700 may be greater than the size of the stage 1100 or the mother substrate MSUB. Also, the lengths, in the first direction (or the X-axis direction) and the second direction (or the Y-axis direction), of the light irradiation module 1700 may be greater than the lengths, in the first direction (or the X-axis direction) and the second direction (or the Y-axis direction), of the stage 1100. Also, the lengths, in the first direction (or the X-axis direction) and the second direction (or the Y-axis direction), of the light irradiation module 1700 may be greater than the lengths, in the first direction (or the X-axis direction) and the second direction (or the Y-axis direction), of the mother substrate MSUB.

The light irradiation module 1700 may include thousands or tens of thousands of light-emitting diodes (LEDs). In one example, in case that the mother substrate MSUB has a size of about 2200 mm×about 2500 mm, the light irradiation module 1700 may include about 50,000 LEDs.

Referring to FIG. 9, the light irradiation module 1700 may include the first light irradiation unit 1710, the second light irradiation unit 1720, and a through hole 1700H.

The first light irradiation unit 1710 may overlap the first display panel cell CEL1. The first light irradiation unit 1710 may apply light to the first display panel cell CEL1.

The second light irradiation unit 1720 may overlap the second display panel cell CEL2. The second light irradiation unit 1720 may apply light to the second display panel cell CEL2.

LEDs are not disposed in the through hole 1700H. FIG. 9 illustrates that the light irradiation module 1700 may include one through hole 1700H, but the disclosure is not limited thereto. As an example, the light irradiation module 1700 may include through holes 1700H. Also, FIG. 9 illustrates that the through hole 1700H is disposed at the center of the light irradiation module 1700, but the location of the through hole 1700H is not particularly limited.

The light irradiation module 1700 may emit UV light or blue light. In one example, the light irradiation module 1700 may emit light of a wavelength of about 405 nm.

The active layers 172c of the light-emitting elements 172 may be excited by UV light or blue light from the light irradiation module 1700. As first semiconductor layers 172a of the light-emitting elements 172 are n-type semiconductors and second semiconductor layers 172b of the light-emitting elements 172 are p-type semiconductors, holes from the second semiconductor layers 172b, which are doped with a p-type dopant enriched with holes, move to the first semiconductor layers 172a, which are doped with an n-type dopant enriched with electrons, and electrons from the first semiconductor layers 172a move to the second semiconductor layers 172b. As a result, permanent dipole moments may be generated in a direction from the second semiconductor layers 172b to the first semiconductor layers 172a. For example, the light-emitting elements 172 may be defined as particles having polarity in their length direction when excited by UV light or blue light from the light irradiation module 1700.

The optical device 1800 may be disposed on the top surface of the light irradiation module 1700. The optical device 1700 may be a polarizing camera device including a polarizing film. The optical device 1800 may be disposed to overlap the through hole 1700H of the light irradiation module 1700. The optical device 1800 may capture an image of the mother substrate MSUB through the through hole 1700H.

The optical device 1800 may capture an image of the light-emitting elements 172 by emitting UV light. The wavelength of the UV light emitted by the optical device 1800 may be less than the wavelength of UV light or blue light emitted by the light irradiation module 1700. In one example, the optical device 1800 may emit light of a wavelength of about 365 nm. In this example, as the active layers 172c of the light-emitting elements 172 are excited by UV light, the active layers 172c of the light-emitting elements 172 can be easily identified from an image captured by the optical device 1800. Accordingly, the precision of alignment of the light-emitting elements 172 can be determined by determining the pattern of alignment of the active layers 172c of the light-emitting elements 172.

Figure 10:
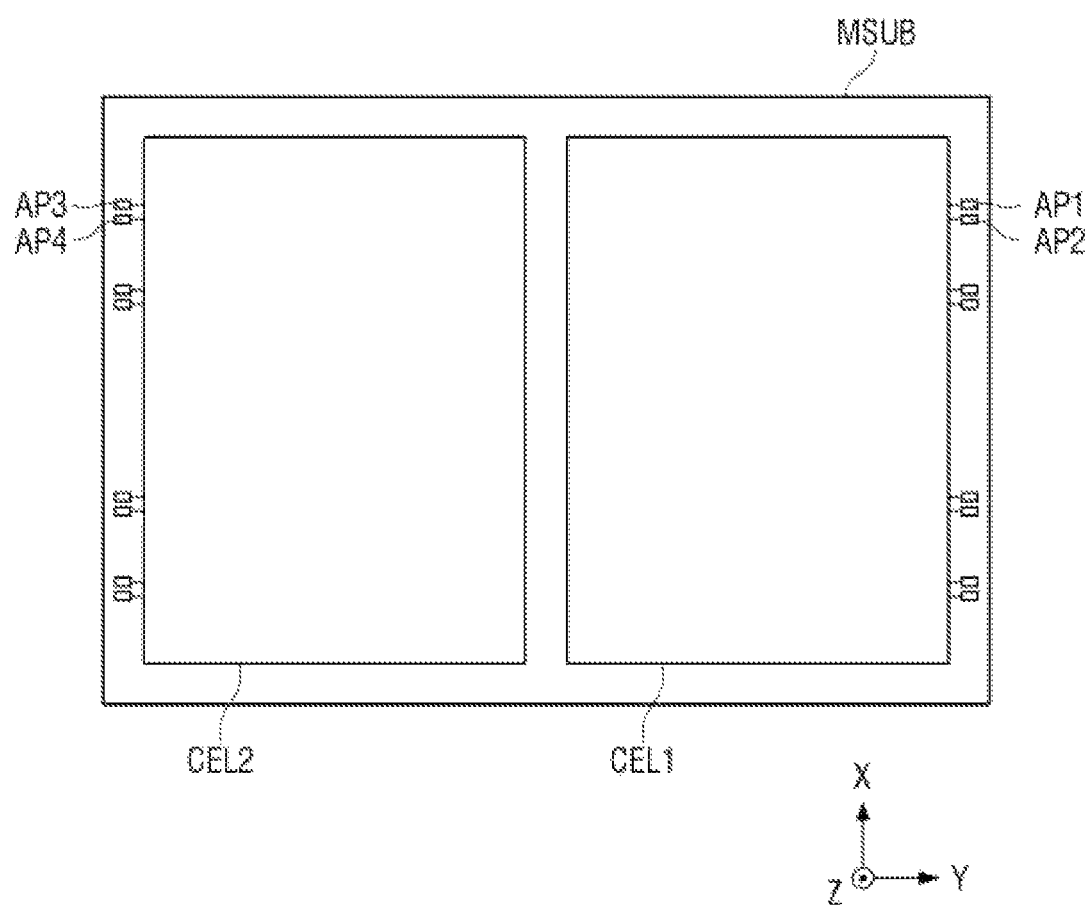
FIG. 10 is a schematic layout view of a mother substrate of FIG. 6.
Figure 11:
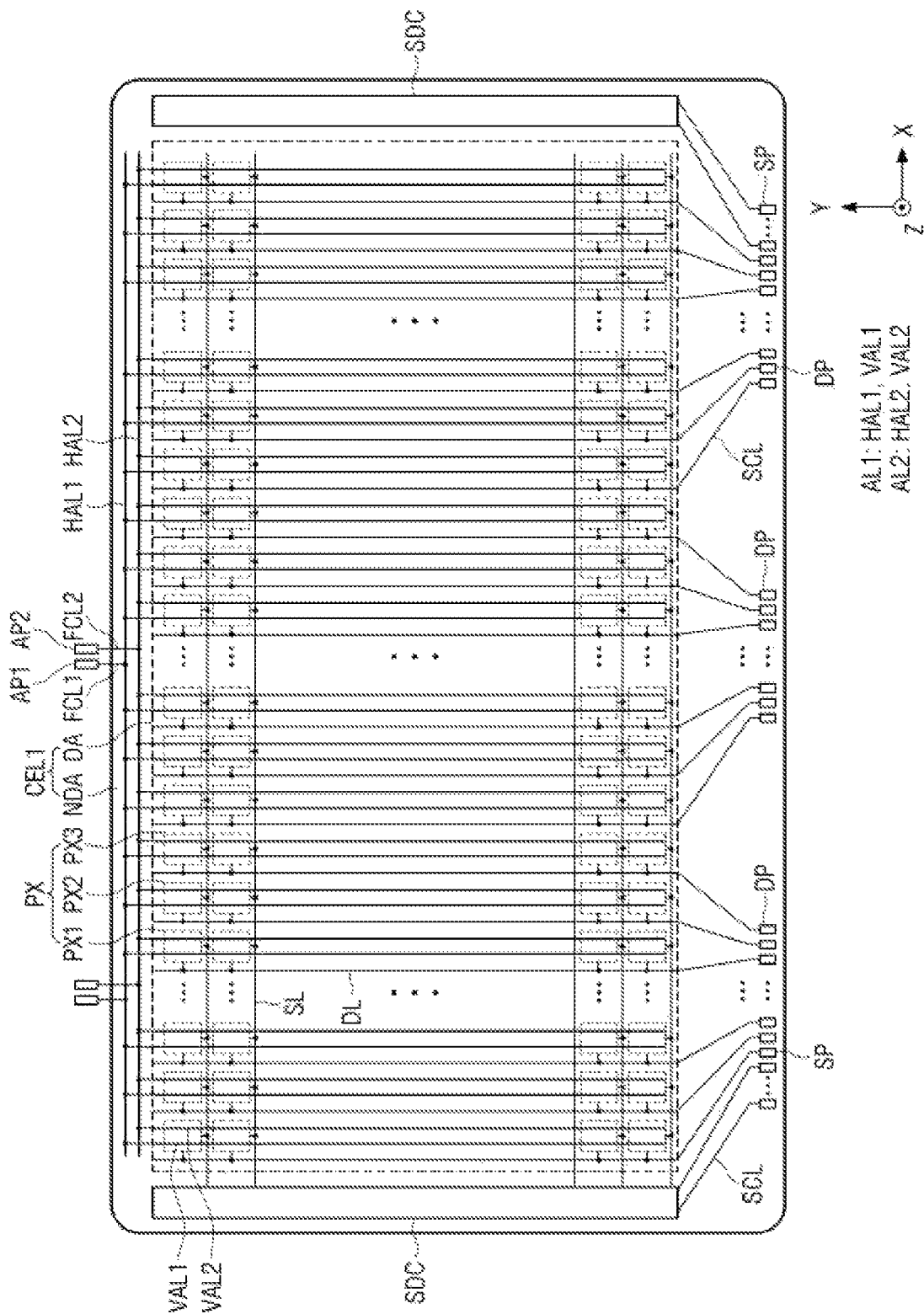
FIG. 11 is a schematic layout view illustrating a first display panel cell, first alignment pads, and second alignment pads of FIG. 10.

FIG. 10 is a schematic layout view of a mother substrate of FIG. 6. FIG. 11 is a schematic layout view illustrating a first display panel cell, first alignment pads, and second alignment pads of FIG. 10.

Referring to FIGS. 10 and 11, the mother substrate MSUB may include the first display panel cell CEL1, the second display panel cell CEL2, the first alignment pads AP1, the second alignment pads AP2, the third alignment pads AP3, and the fourth alignment pads AP4. FIG. 10 illustrates that the mother substrate MSUB may include two display panel cells, but the disclosure is not limited thereto.

The first and second display panel cells CEL1 and CEL2 may be disposed adjacent to each other. The first display panel cell CEL1, the first alignment pads AP1, and the second alignment pads AP2 may be symmetrical with the second display panel cell CEL2, the third alignment pads AP3, and the fourth alignment pads AP4, respectively, in the second direction (or the Y-axis direction). In one example, the first alignment pads AP1 and the second alignment pads AP2 may be disposed on the first side of the first display panel cell CEL1, and the third alignment pads AP3 and the fourth alignment pads AP4 may be disposed on the second side of the second display panel cell CEL2.

Referring to FIG. 11, the first display panel cell CEL1 may include pixels PX, scan drivers SDC, scan lines SL, data lines DL, a first alignment line AL1, a second alignment line AL2, first connecting lines FCL1, second connecting lines FCL2, display pads DP, and scan pads SP. The scan drivers SDC, the scan lines SL, the data lines DL, the display pads DP, and the scan pads SP are substantially the same as their respective counterparts of FIG. 2, and thus, detailed descriptions thereof will be omitted.

The first alignment line AL1 may include a first horizontal alignment line HAL1 and first vertical alignment lines VAL1. The first horizontal alignment line HAL1 may be substantially the same as the first floating line FL1 of FIG. 2. The first horizontal alignment line HAL1 may be connected to the first alignment pads AP1 via the first connecting lines FCL1. The first vertical alignment lines VAL1 may extend from the first horizontal alignment line HAL1 in the second direction (or the Y-axis direction). The first vertical alignment lines VAL1 may be disposed in arrays of subpixels (PX1, PX2, and PX3) that are arranged or disposed in the second direction (or the Y-axis direction).

The second alignment line AL2 may include a second horizontal alignment line HAL2 and second vertical alignment lines VAL1. The second horizontal alignment line HAL2 may be substantially the same as the second floating line FL2 of FIG. 2. The second horizontal alignment line HAL2 may be connected to the second alignment pads AP2 via the second connecting lines FCL2. The second vertical alignment lines VAL2 may extend from the second horizontal alignment line HAL2 in the second direction (or the Y-axis direction). The second vertical alignment lines VAL2 may be disposed in the arrays of subpixels (PX1, PX2, and PX3) that are arranged or disposed in the second direction (or the Y-axis direction).

Referring to FIG. 11, the first alignment line AL1 may be connected to the first alignment pads AP1 via the first connecting lines FCL1, and the second alignment line AL2 may be connected to the second alignment pads AP2 via the second connecting lines FCL2. The first and second alignment lines AL1 and Al2 may be electrically connected in common to all subpixels (PX1, PX2, and PX3) of a display panel 100. In a case where the first alignment signal is applied to the first alignment line AL1 via the first probe pins PP1 and the first alignment pads AP1 and the second alignment signal is applied to the second alignment line AL2 via the first probe pins PP1 and the second alignment pads AP2, the light-emitting elements 172 in each of the subpixels (PX1, PX2, and PX3) of the display panel 100 may be aligned by an electric field formed by the first alignment signal from the first alignment line AL1 and the second alignment signal from the second alignment line AL2. As a dielectric phoretic force is applied to the light-emitting elements 172, the second semiconductor layers 172b of the light-emitting elements 172 may be placed near the first alignment lines AL1. For example, the light-emitting elements 172 can be deflected, and the precision of alignment of the light-emitting elements 172 can be improved.

The first and second alignment lines AL1 and AL2 may be disconnected after the application of the first and second alignment signals for aligning the light-emitting elements 172. As a result, the first and second alignment lines AL1 and AL2 may be divided into the floating lines (FL1 and FL2), the connecting lines (FCL1, FCL2, FCL3, and FCL4), first electrodes 171, and second electrodes 173 of FIG. 2. The first and second display panel cells CEL1 and CEL2 may be cut and divided by a scribing process, and as a result, the display panel 100 of FIG. 2 can be obtained.

The second display panel cell CEL2 is substantially the same as the first display panel cell CEL1 of FIG. 11, and thus, a detailed description thereof will be omitted.

Figure 12:
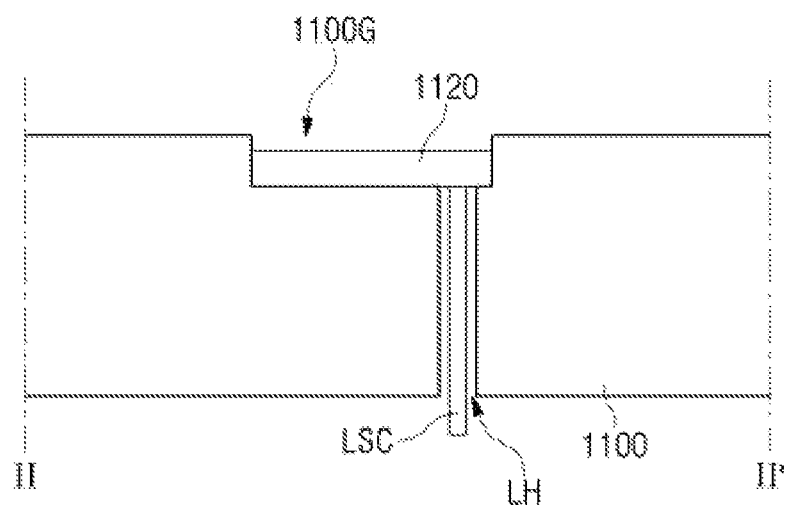
FIG. 12 is a schematic cross-sectional view taken along line II-IF of FIG. 7.
Figure 13:
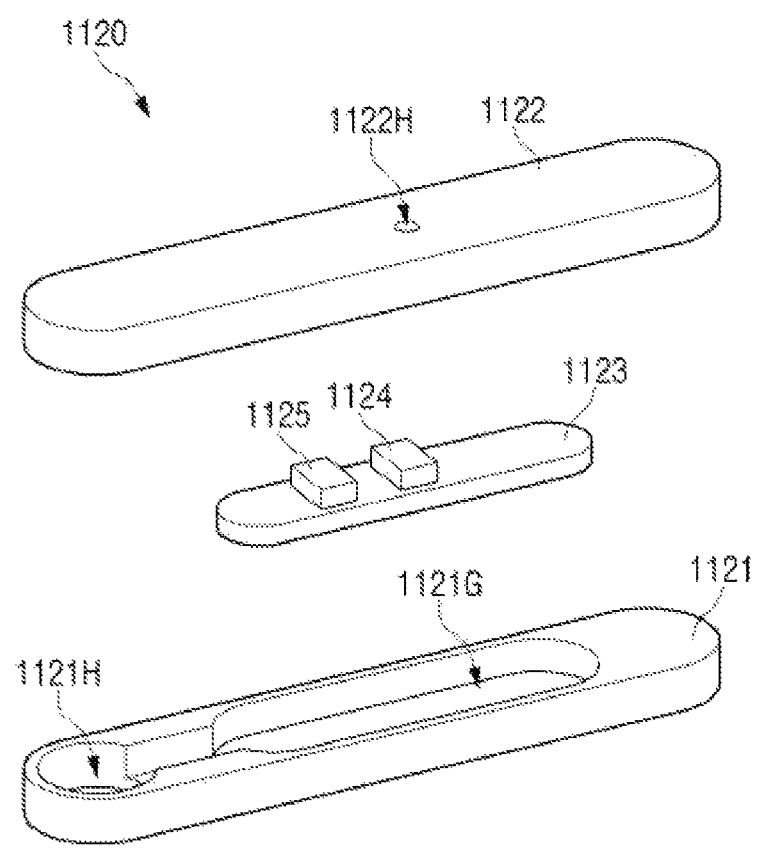
FIG. 13 is an exploded perspective view of a sensor device of FIG. 12.

FIG. 12 is a schematic cross-sectional view taken along line II-IF of FIG. 7. FIG. 13 is an exploded perspective view of a sensor device of FIG. 12.

Referring to FIGS. 12 and 13, the stage 1100 may include a sensor device 1120, a sensor connecting line LSC, a sensor groove 1100G, and a line hole LH.

The sensor device 1120 may include a lower case 1121, an upper case 1122, a sensor circuit board 1123, a light detection sensor 1124, and a temperature sensor 1125.

The lower case 1121 may include a storage groove 1121G, in which the circuit board 1123 is stored, and a lower hole 1121H, in which a sensor connecting line LSC is disposed.

The upper case 1122 may include an upper hole 1122H, which exposes the top surface of the light detection sensor 1124.

The lower case 1121 and the upper case 1122 may be fixed by a fixing member. The fixing member may be an adhesive member such as an adhesive or an adhesive tape or a screw.

The sensor circuit board 1123 may be electrically connected to the sensor connecting line LSC. The sensor circuit board 1123 may be a printed circuit board (PCB).

The light detection sensor 1124 and the temperature sensor 1125 may be formed as integrated circuits (ICs) and may be mounted on the top surface of the circuit board 1123. The light detection sensor 1124 may overlap the upper hole 1122H of the upper case 1122. Accordingly, the light detection sensor 1124 can generate a first sensor signal based on light incident thereupon from the light irradiation module 1700 through the upper hole 1122H of the upper case 1122. The temperature sensor 1125 may generate a second sensor signal based on the temperature of the stage 1100.

The sensor connecting line LSC may extend to the bottom surface of the stage 1100 through the lower hole 1121H. Accordingly, the sensor connecting line LSC can electrically connect the sensor circuit board 1123 and the controller 1900 (of FIG. 14). Thus, the first sensor signal from the light detection sensor 1124 and the second sensor signal from the temperature sensor 1125 can be input to the controller 1900 via the sensor connecting line LSC.

The sensor groove 1100G may be disposed on the top surface of the stage 1100 and may be a recess groove. The sensor groove 1100G may be a groove in which the sensor device 1120 can be stored.

The line hole LH may be a hole that penetrates the stage 1100. The line hole LH may be integral with the sensor groove 1100G.

Figure 14:
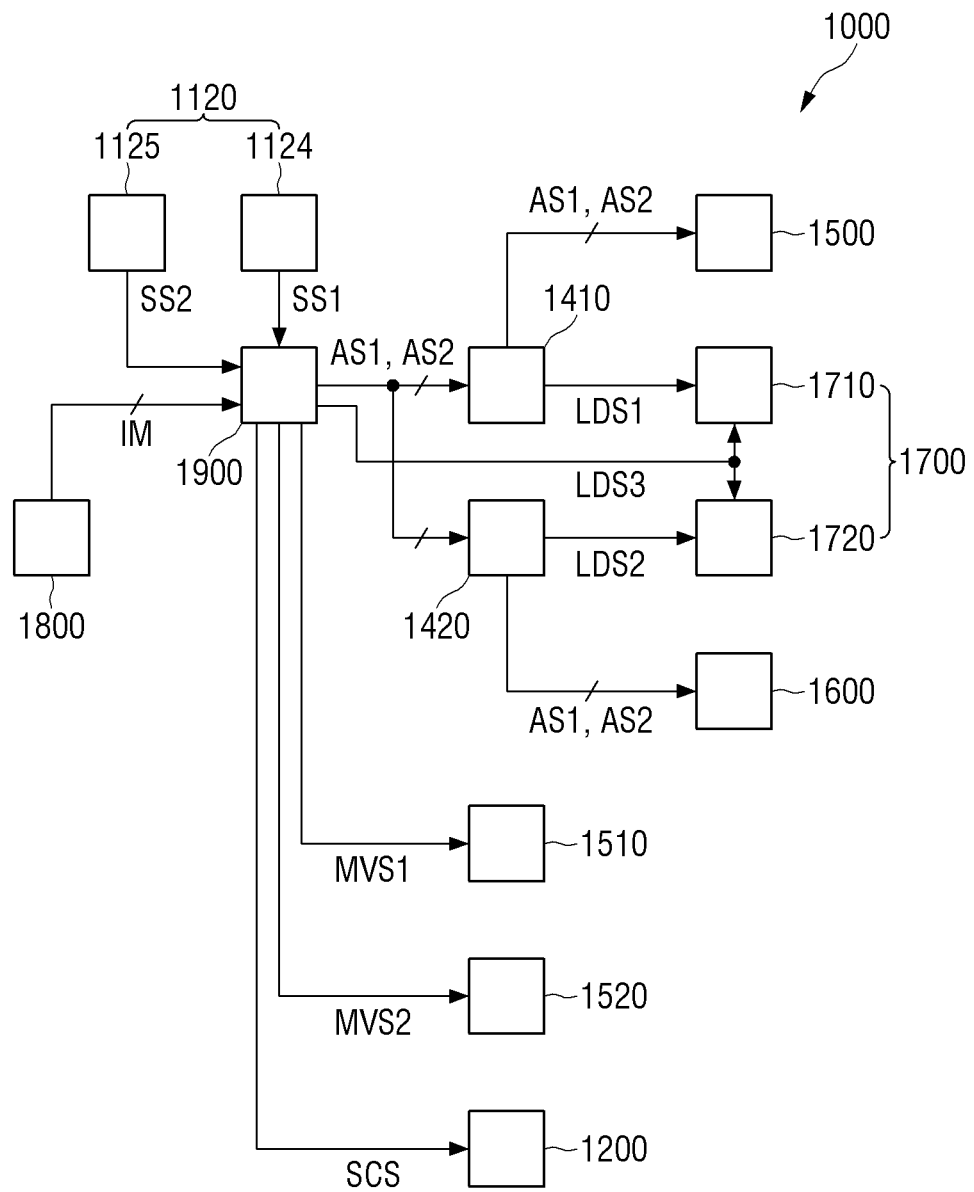
FIG. 14 is a block diagram of the apparatus of FIG. 6.

FIG. 14 is a block diagram of the apparatus of FIG. 6.

Referring to FIG. 14, the apparatus 1000 may include the sensor devices 1120, the stage mover 1200, the first voltage output module 1410, the second voltage output module 1420, the first electric field applying module 1500, the first module mover 1510, the second electric field applying module 1600, the second module mover 1520, the light irradiation module 1700, the optical device 1800, and the controller 1900.

The controller 1900 controls the operations of all the elements of the apparatus 1000. The controller 1900 may be electrically connected to the sensor device 1120, the stage mover 1200, the first voltage output module 1410, the second voltage output module 1420, the first electric field applying module 1500, the first module mover 1510, the second electric field applying module 1600, the second module mover 1520, the light irradiation module 1700, and the optical device 1700.

The controller 1900 may receive first sensor signals SS1 from light detection sensors 1124 of the sensor devices 1120 and second sensor signals SS2 from temperature sensors 1125 of the sensor devices 1120. The first sensor signals SS1 may be light detection data generated based on light incident upon the light detection sensors 1124 form the light irradiation module 1700. The second sensor signals SS2 may be temperature data generated based on the temperature of the stage 1100. The controller 1900 may determine the timing of the application of light for the light irradiation module 1700 based on the first sensor signal SS1. The controller 1900 may detect the temperature of the stage 1100 based on the second sensor signal SS2.

The controller 1900 may output a stage control signal SCS to the stage mover 1200. The stage mover 1200 may lift up or down or raise or lower the stage 1100 in accordance with the stage control signal SCS. In one example, in a case where the controller 1900 outputs a first-level stage control signal SCS, the stage mover 1200 may lift up or raise the stage 1100 by a height. Also, in one example, in a case where the controller 1900 outputs a second-level stage control signal SCS, the stage mover 1200 may lift down or lower the stage 1100 by a height.

The controller 1900 may output first and second alignment signals AS1 and AS2 to the first and second voltage output modules 1410 and 1420, respectively. The first alignment signal AS1 may be a ground voltage or a direct current (DC) voltage. The second alignment signal AS2 may be an alternating current (AC) voltage.

The first voltage output module 1410 may generate a first emission driving signal LDS1 in accordance with the second alignment signal AS2. In one example, the second alignment signal AS2 may repeatedly increase from a first low-level voltage to a first high-level voltage and then decrease from the first high-level voltage to the first low-level voltage. In this example, the first voltage output module 1410 may generate a first emission driving signal LDS1 having a second high-level voltage during a period in case that the second alignment signal AS2 is being switched from a first voltage to a second voltage and having a second low-level voltage during other periods. The second alignment signal AS2 and the first emission driving signal LDS1 will be described later with reference to FIG. 15.

The second voltage output module 1420 may generate a second emission driving signal LDS2 in accordance with the second alignment signal AS2. In one example, the second voltage output module 1420 may generate a second emission driving signal LDS2 having the second high-level voltage during a period in case that the second alignment signal AS2 is being switched from the first voltage to the second voltage and having the second low-level voltage during other periods.

The first voltage output module 1410 may output the first and second alignment signals AS1 and AS2 to the first electric field applying module 1500. The first alignment signal AS1 may be applied to the first alignment pads AP1 of the mother substrate MSUB via the first probe pins PP1 of the first electric field applying module 1500, and the second alignment signal AS2 may be applied to the second alignment pads AP2 of the mother substrate MSUB via the first probe pins PP1 of the first electric field applying module 1500.

The second voltage output module 1420 may output the first and second alignment signals AS1 and AS2 to the second electric field applying module 1600. The first alignment signal AS1 may be applied to the third alignment pads AP3 of the mother substrate MSUB via the second probe pins PP2 of the second electric field applying module 1600, and the second alignment signal AS2 may be applied to the fourth alignment pads AP4 of the mother substrate MSUB via the second probe pins PP2 of the second electric field applying module 1600.

The first alignment signal AS1 may be applied to the first alignment lines AL1 of the first and second display panel cells CEL1 and CEL2 and the second alignment signal AS2 may be applied to the second alignment lines AL2 of the first and second display panel cells CEL1 and CEL2. Thus, the light-emitting elements 172 in each of the subpixels (PX1, PX2, and PX3) of the display panel 100 can be aligned by an electric field formed by the first alignment signal AS1 from the first alignment lines AL1 and the second alignment signal AS2 the second alignment lines AL2.

The first voltage output module 1410 may output the first emission driving signal LDS1 to the first light irradiation unit 1710. The LEDs of the first light irradiation unit 1710 may emit light in accordance with the first emission driving signal LDS1.

The second voltage output module 1420 may output the second emission driving signal LDS2 to the second light irradiation unit 1720. The LEDs of the second light irradiation unit 1720 may emit light in accordance with the second emission driving signal LDS2.

The controller 1900 may generate a third emission driving signal LDS3 and may output the third emission driving signal LDS3 to the first and second light irradiation units 1710 and 1720. The LEDs of each of the first and second light irradiation units 1710 and 1720 may emit light in accordance with the third emission driving signal LDS3.

The duty ratio of the third emission driving signal LDS3 may be greater than the duty ratio of the first or second emission driving signal LDS1 or LDS2.

The controller 1900 may output a first module moving signal MVS1 to the first module mover 1510 and a second module moving signal MVS2 to the second module mover 1520. The first module mover 1510 may lift up or down or raise or lower the first electric field applying module 1500 in accordance with the first module moving signal MVS1. In one example, in a case where the controller 1900 outputs a first-level first module moving signal MVS1, the first module mover 1510 may lift up or raise the first electric field applying module 1500 by a height. Also, in one example, in a case where the controller 1900 outputs a second-level first module moving signal MVS1, the first module mover 1510 may lift down or lower the first electric field applying module 1500 by a height.

The second module mover 1520 may lift up or down or raise or lower the second electric field applying module 1600 in accordance with the second module moving signal MVS2. In one example, in a case where the controller 1900 outputs a first-level second module moving signal MVS2, the second module mover 1520 may lift up or raise the second electric field applying module 1600 by a height. Also, in one example, in a case where the controller 1900 outputs a second-level second module moving signal MVS2, the second module mover 1520 may lift down or lower the second electric field applying module 1600 by a height.

The controller 1900 may receive optical image data IM from the optical device 1800. The optical image data IM may be an image of the light-emitting elements 172 of each of the first and second display panel cells CEL1 and CEL2 of the mother substrate MSUB, captured by the optical device 1800. The controller 1900 may determine the precision of alignment of the light-emitting elements 172 by determining the pattern of alignment of the active layers 172*c* of the light-emitting elements 172 based on the optical image data IM.

As already mentioned above, the apparatus 1000 may apply the first and second alignment signals AS1 and AS2 to the first and second alignment lines AL1 and AL2, respectively, of each of the first and second display panel cells CEL1 and CEL2 of the mother substrate MSUB via the first and second electric field applying modules 1500 and 1600, respectively, by applying UV light or blue light to the first and second display panel cells CEL1 and CEL2 via the light irradiation module 1700. As the active layers 172c of the light-emitting elements 172 in each of the first and second display panel cells CEL1 and CEL2 are excited by the UV light or the blue light from the light irradiation module 1700, permanent dipole moments may be generated in a direction from the second semiconductor layers 172b of the light-emitting elements 172, which are doped with a p-type dopant, to the first semiconductor layers 172a of the light-emitting elements 172, which are doped with an n-type dopant. Thus, as a dielectrophoretic force is applied to the light-emitting elements 172 by an electric field, the second semiconductor layers 172b of the light-emitting elements 172 can be placed near the first alignment line AL1. For example, the light-emitting elements 172 can be deflected, and the precision of alignment of the light-emitting elements 172 can be improved.

Figure 15:
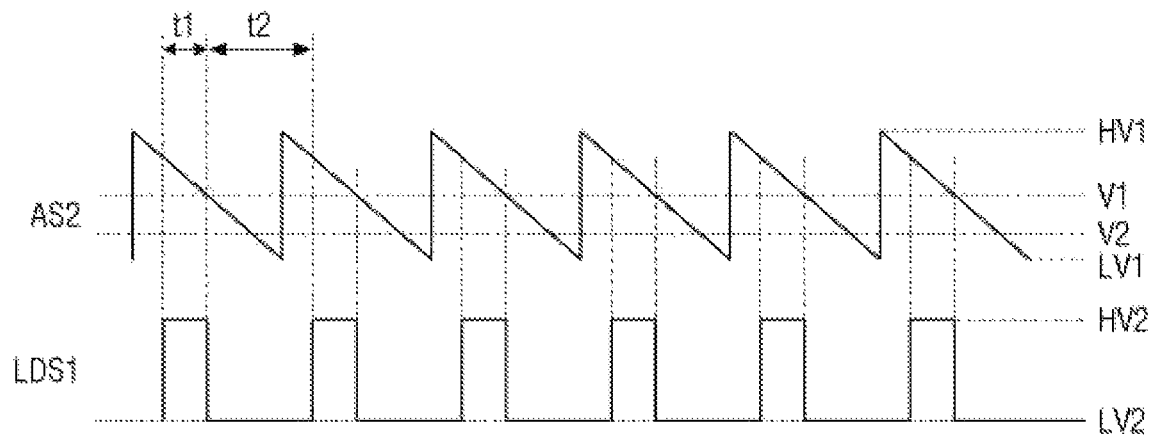
FIG. 15 is a waveform diagram showing a second alignment signal and a first emission driving signal of FIG. 14.

FIG. 15 is a waveform diagram showing the second alignment signal and the first emission driving signal of FIG. 14.

Referring to FIG. 15, the second alignment signal AS2 may repeatedly increase from a first low-level voltage LV1 to a first high-level voltage HV1 and then decrease from the first high-level voltage HV1 to the first low-level voltage LV1.

In one example, the second alignment signal AS2 may have a sawtooth waveform. In this example, the period over which the second alignment signal AS2 increases from the first low-level voltage LV1 to the first high-level voltage HV1 may be shorter than the period over which the second alignment signal AS2 decreases from the first high-level voltage HV1 to the first low-level voltage LV1. In other words, the second alignment signal AS2 may suddenly increase from the first low-level voltage LV1 to the first high-level voltage HV1 and may then gradually decrease from the first high-level voltage HV1 to the first low-level voltage LV1.

In another example, the second alignment signal AS2 may have a ramp waveform so that the period over which the second alignment signal AS2 increases from the first low-level voltage LV1 to the first high-level voltage HV1 may be longer than the period over which the second alignment signal AS2 decreases from the first high-level voltage HV1 to the first low-level voltage LV1. In other words, the second alignment signal AS2 may gradually increase from the first low-level voltage LV1 to the first high-level voltage HV1 and may then suddenly decrease from the first high-level voltage HV1 to the first low-level voltage LV1.

The waveform of the second alignment signal AS2 is not particularly limited, and the second alignment signal AS2 may have various waveforms other than sawtooth and ramp waveforms.

The first emission driving signal LDS1 may have a second high-level voltage HV2 during a period for which the second alignment signal AS2 is being switched from a first-level voltage V1 to a second-level voltage V2 and may have a second low-level voltage LV2 during other periods. The LEDs of the first light irradiation unit 1710 may be turned on during a first period t1 for which the first emission driving signal LDS1 has the second high-level voltage HV2 and may be turned off during a second period t2 for which the first emission driving signal LDS1 has the second low-level voltage LV2. Thus, the first light irradiation unit 1710 may apply light to the first display panel cell CEL1 during the first period t1, but may not apply light to the second display panel cell CEL2 during the second period t2. For example, the first period t1 may be defined as a period for which the first light irradiation unit 1710 applies light.

The duty ratio of the first emission driving signal LDS1 may be in a range of about 1% to about 50%. If the duty ratio of the first emission driving signal LDS1 is less than about 1%, the light-emitting elements 172 of the first display panel cell CEL1 may not be able to be properly deflected. If the duty ratio of the first emission driving signal LDS1 is greater than about 50%, a solution including the light-emitting elements 172 of the first display panel cell CEL1 may reach its melting point due to an increase in the temperature.

The first- and second-level voltages V1 and V2 may be lower than the first high-level voltage HV1 and higher than the first low-level voltage LV1. The second low-level voltage LV2 may be lower than the first high-level voltage LV1, and the second high-level voltage HV2 may be higher than the first high-level voltage HV1. However, the disclosure is not limited to this.

If the first-level voltage V1 is higher than the second-level voltage V2, the first emission driving signal LDS1 may have the second high-level voltage HV2 during the period over which the second alignment signal AS2 decreases from the first-level voltage V1 to the second-level voltage V2 and may have the second low-level voltage LV2 during other periods. If the first-level voltage V1 is lower than the second-level voltage V2, the first emission driving signal LDS1 may have the second high-level voltage HV2 during the period over which the second alignment signal AS2 increases from the first-level voltage V1 to the second-level voltage V2 and may have the second low-level voltage LV2 during other periods.

The second alignment signal AS2, the first emission driving signal LDS1, and the second emission driving signal DS2 may have a frequency of about 50 kHz, but the disclosure is not limited thereto.

As shown in FIG. 15, the first and second emission driving signals LDS1 and LDS2 can be generated based on the second alignment signal AS2 and can thus be synchronized with the second alignment signal AS2.

Figure 16:
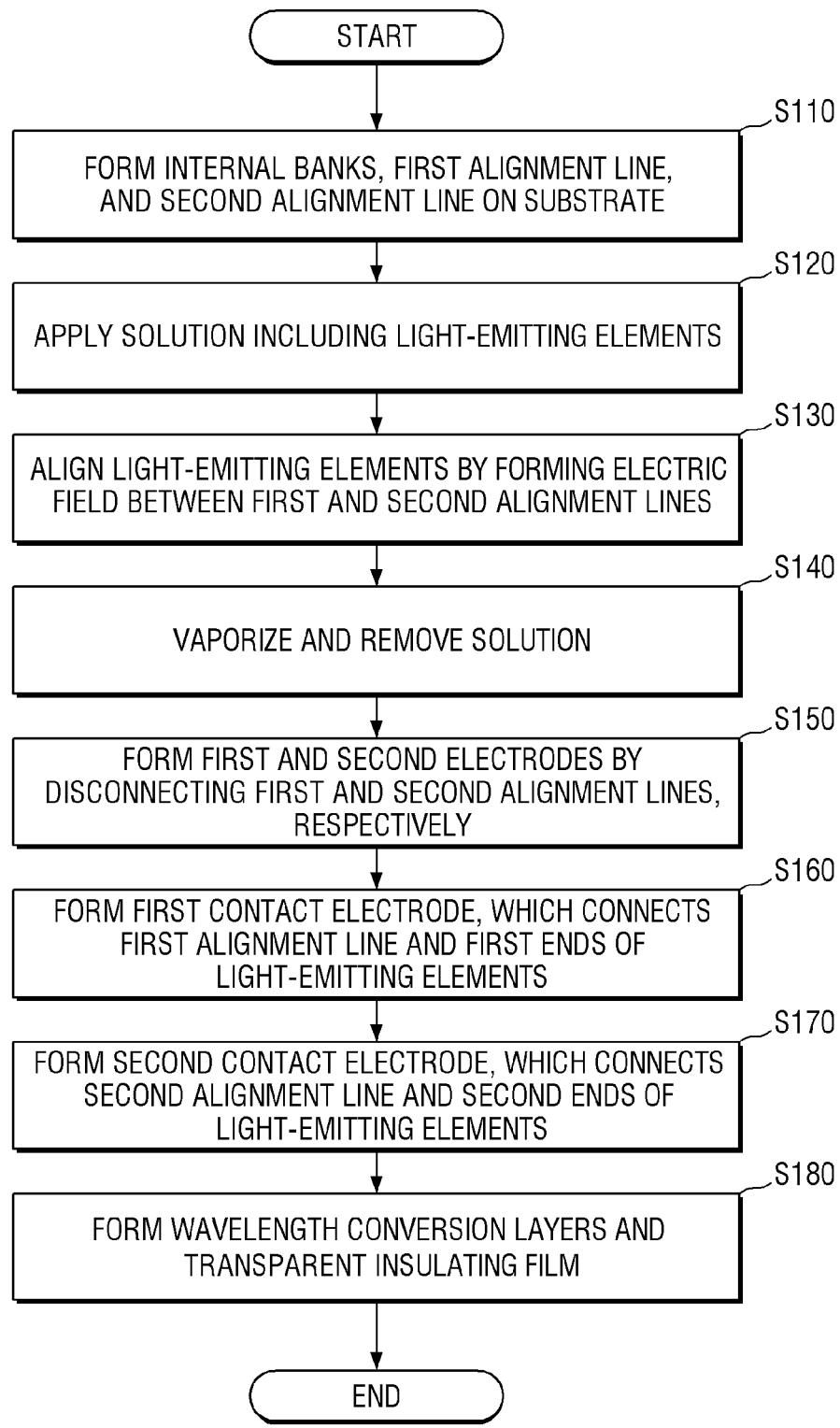
FIG. 16 is a flowchart illustrating a method of manufacturing a display device according to an embodiment.

FIG. 16 is a flowchart illustrating a method of manufacturing a display device according to an embodiment. FIGS. 17 through 24 are schematic cross-sectional views of a display panel for explaining the method of FIG. 16. FIGS. 17 through 24 are schematic cross-sectional views taken along line I-I' of FIG. 3.

Figure 17:
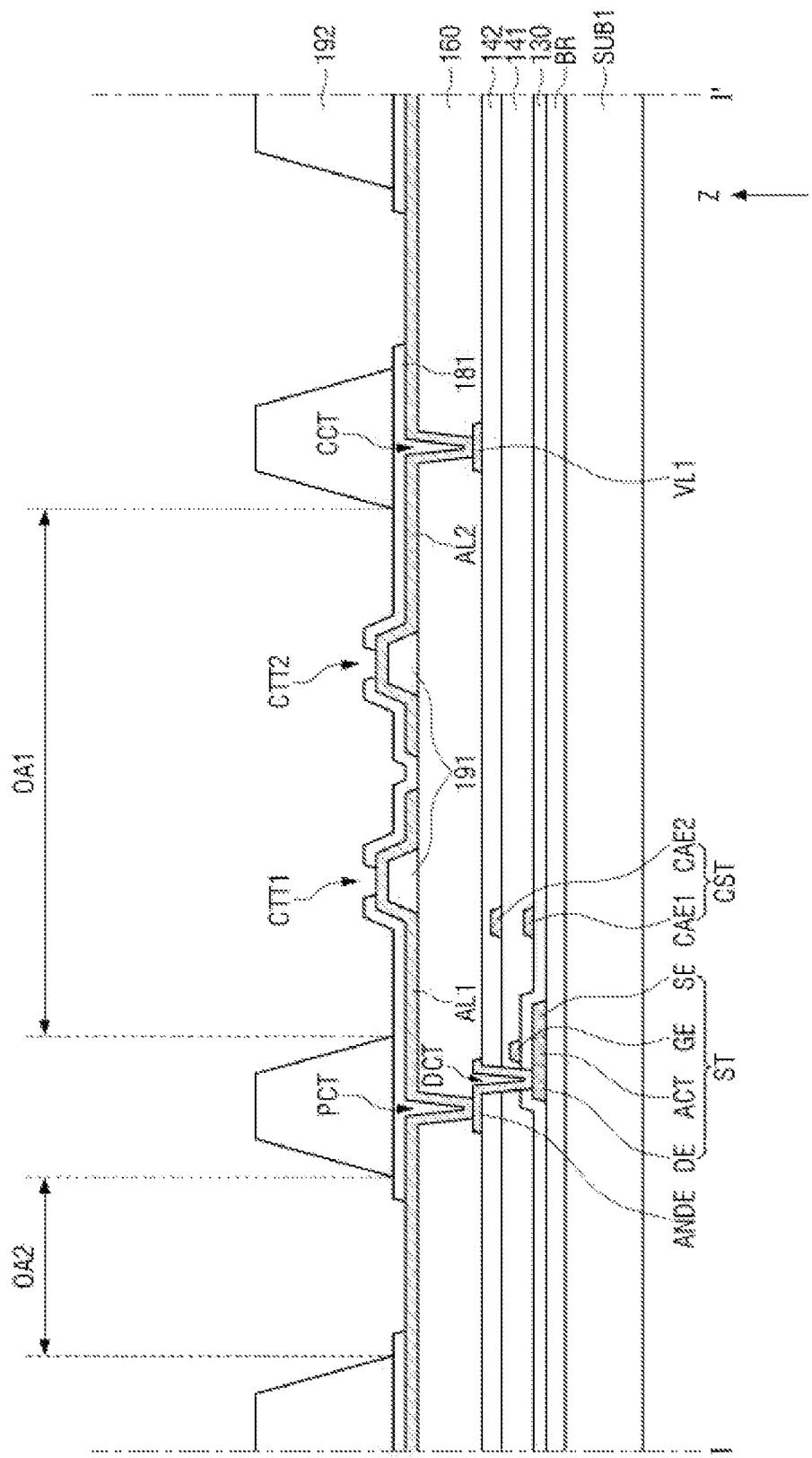
FIGS. 17 through 24 are schematic cross-sectional views of a display panel for explaining the method of FIG. 16.

First, referring to FIGS. 16 and 17, internal banks 191, a first alignment line AL1, and a second alignment line AL2 are formed on a substrate SUB1 (S110).

For example, a barrier film BR is formed by depositing an inorganic material on the substrate SUB1.

Thereafter, a semiconductor layer including an active layer ACT, a source electrode SE, and a drain electrode DE of a TFT "ST" is formed on the barrier film BR via photolithography. The semiconductor layer may include polycrystalline silicon, monocrystalline silicon, low-temperature polycrystalline silicon, amorphous silicon, or an oxide semiconductor.

Thereafter, a gate insulating film 130 is formed by depositing an inorganic material on the active layer ACT, the source electrode SE, and the drain electrode DE of the TFT "ST".

Thereafter, a first gate conductive layer including a gate electrode GE of the TFT "ST" and a first capacitor electrode CAE1 of a capacitor CST is formed on the gate insulating film 130 via photolithography.

Thereafter, the source electrode SE and the drain electrode DE are doped with ions or impurities using the gate electrode GE as a mask. Accordingly, the source electrode SE and the drain electrode DE may have conductivity.

Thereafter, a first interlayer insulating film 141 is formed by depositing an inorganic material on the gate electrode GE and the first capacitor electrode CAE1.

Thereafter, a second gate conductive layer including a second capacitor electrode CAE2 of the capacitor CST is formed on the first interlayer insulating film 141 via photolithography.

Thereafter, a second interlayer insulating film 142 is formed by depositing an inorganic material on the second capacitor electrode CAE2.

Thereafter, a drain contact hole DCT, which exposes the drain electrode DE, is formed by penetrating the gate insulating film 130, the first interlayer insulating film 141, and the second interlayer insulating film 142 via photolithography.

Thereafter, a data conductive layer including a connecting electrode ANDE and a first power line VL1 is formed on the second interlayer insulating film 142 via photolithography. The connecting electrode ANDE may be electrically connected to the drain electrode DE through the drain contact hole DCT.

Thereafter, a planarization film 160 is formed by depositing an organic material on the connecting electrode ANDE.

Thereafter, the internal banks 191 are formed by depositing an organic material.

Thereafter, a pixel contact hole PCT, which exposes the connecting electrode ANDE, and a common contact hole CCT, which exposes the first power line VL1, are formed at the same time by penetrating the planarization film 160 via photolithography.

Thereafter, the first and second alignment lines AL1 and AL2 are formed on the planarization film 160 via photolithography. The first alignment line AL1 may be electrically connected to the connecting electrode ANDE through the pixel contact hole PCT. The second alignment line AL2 may be electrically connected to the first power line VL1 through the common contact hole CCT.

Thereafter, a first insulating film 181 is formed by depositing an inorganic material on first and second electrodes 171 and 173.

Thereafter, an outer bank 192 is formed by depositing an organic material on the first insulating film 181.

Thereafter, portions of the first insulating film 181 is removed via photolithography to expose the first and second alignment lines AL1 and AL2 in a second opening OA2.

Figure 18:
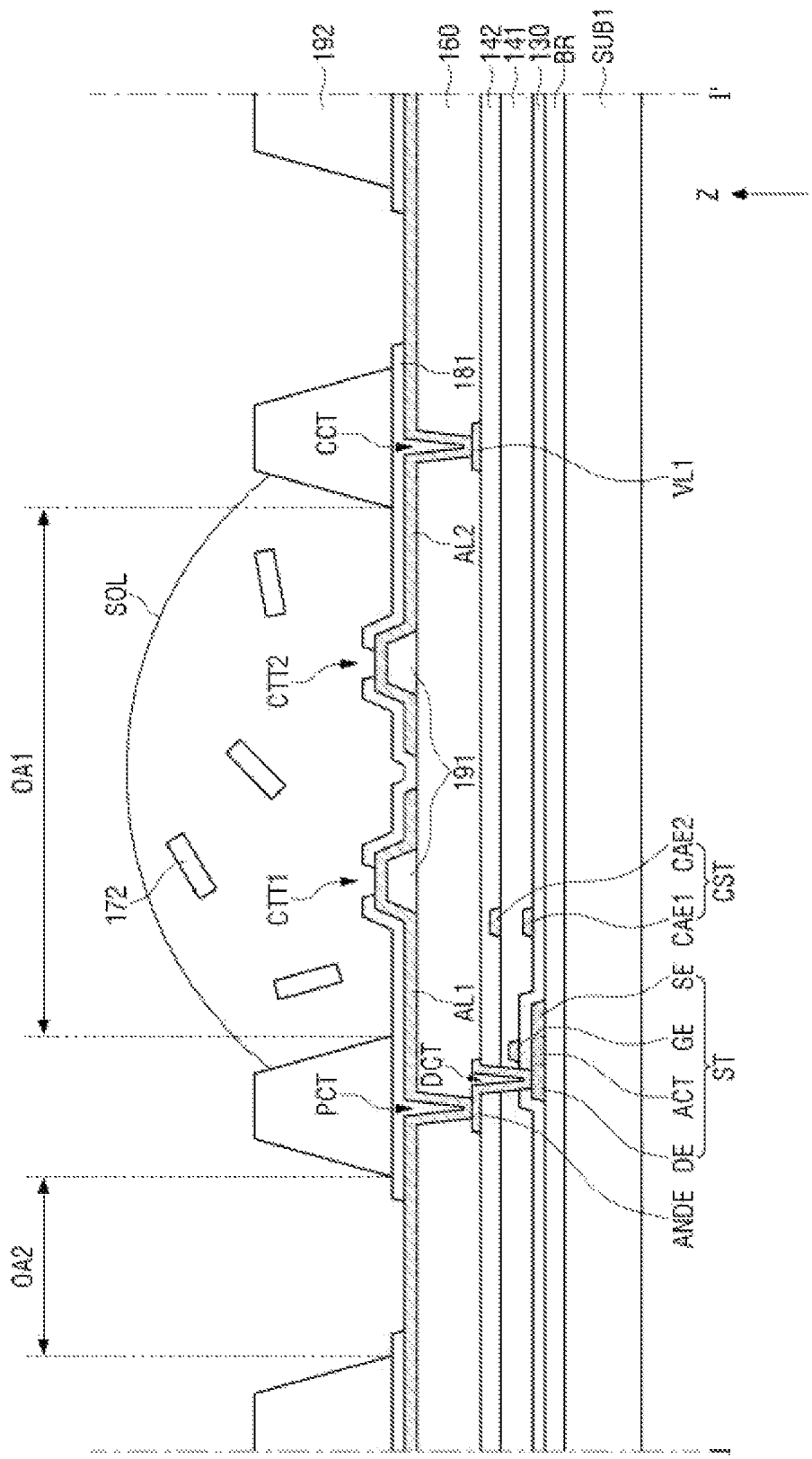

Second, referring to FIGS. 16 and 18, a solution SOL including light-emitting elements 172 is applied on the first and second alignment lines AL1 and AL2 (S120).

The light-emitting elements 172 may be randomly distributed in the solution SOL. The solution SOL may be applied on the first and second alignment lines AL1 and AL2 via inkjet printing, inkjet injection, slot die coating, or slot die printing.

Figure 19:
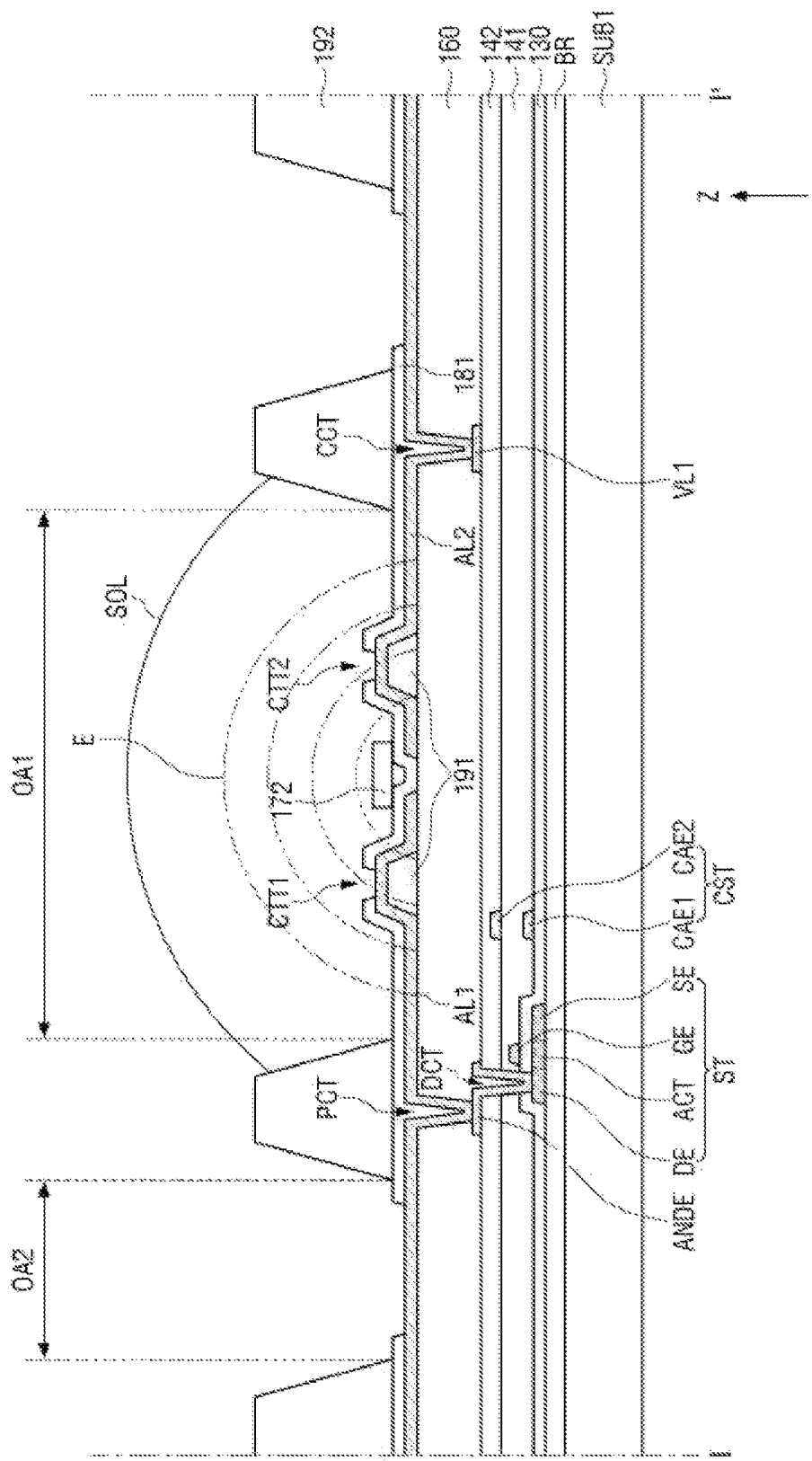

Third, referring to FIGS. 16 and 19, the light-emitting elements 172 are aligned by forming an electric field between the first and second alignment lines AL1 and AL2 (S130).

For example, the first alignment line AL1 may receive a first alignment voltage via first alignment pads AP1, and the second alignment line AL2 may receive a second alignment voltage via second alignment pads AP2. The first alignment voltage may be a ground voltage, and the second alignment voltage may be an AC voltage. Accordingly, the electric field E may be formed between the first and second alignment lines AL1 and Al2. As the light-emitting elements 172 receive a dielectrophoretic force from the electric field E, the light-emitting elements 172 can be aligned between the first and second alignment lines AL1 and AL2.

Figure 20:
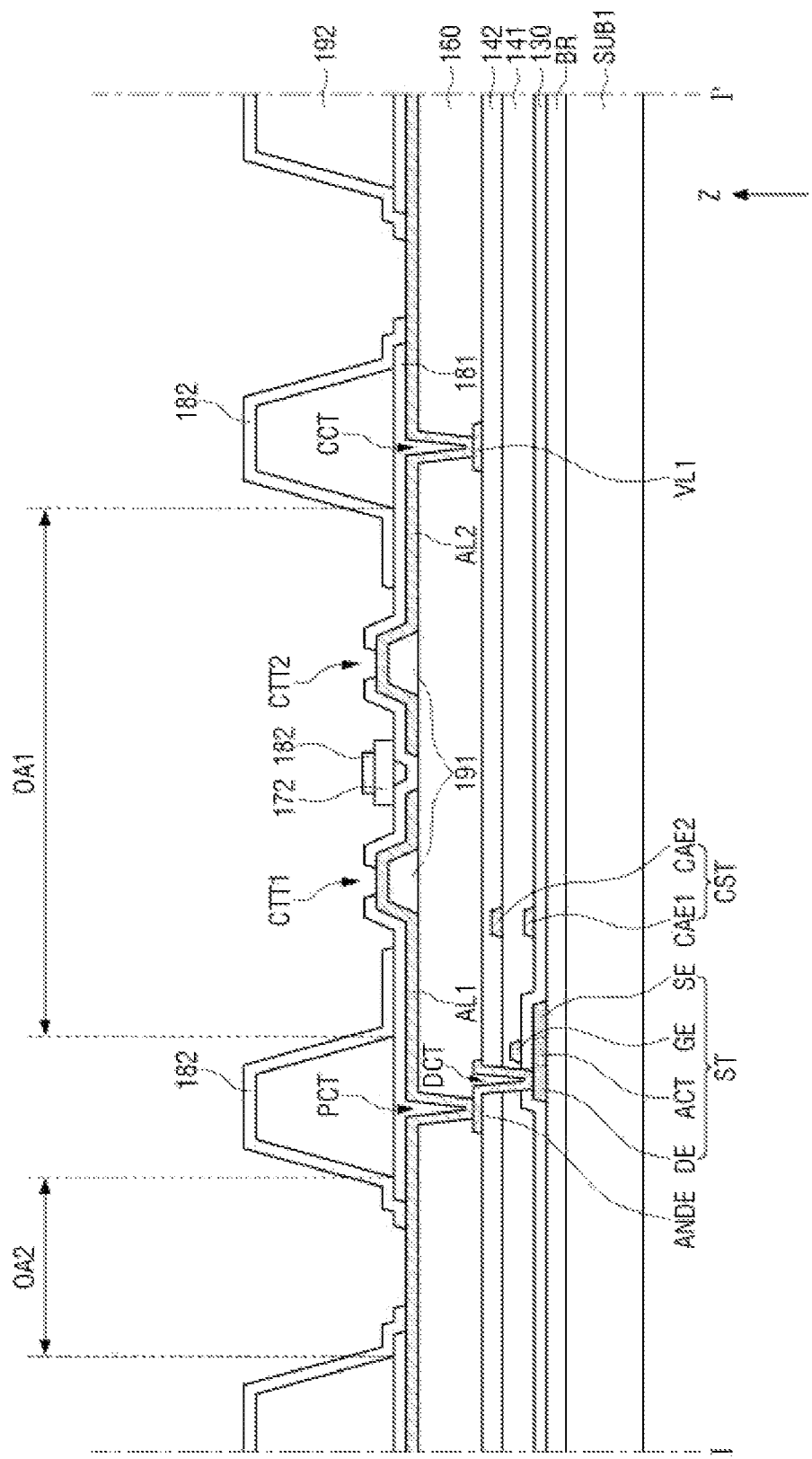

Fourth, referring to FIGS. 16 and 20, the solution SOL may be vaporized and removed after aligning the light-emitting elements 172 between the first and second electrodes 210 and 220 (S140).

The light-emitting elements 172 may be aligned by forming the electric field E between the first and second alignment lines AL1 and AL2, which are adjacent to each other, and the solution SOL may be dried. If the solution SOL is dried and vaporized unevenly, a hydrodynamic force may be generated in the solution SOL. The light-emitting elements 172 may be moved by the hydrodynamic force. Thus, the drying of the solution SOL may be performed while maintaining the alignment of the light-emitting elements 172.

Thereafter, a second insulating film 182 is formed by depositing an inorganic material on the first insulating film 181 and the light-emitting elements 172. The light-emitting elements 172 may be fixed by the second insulating film 182.

Thereafter, portions of the second insulating film 182 is removed via photolithography to expose first ends and second ends of the light-emitting elements 172 in a first opening OA1 and expose the first and second alignment lines AL1 and AL2 in the second opening OA2.

Figure 21:
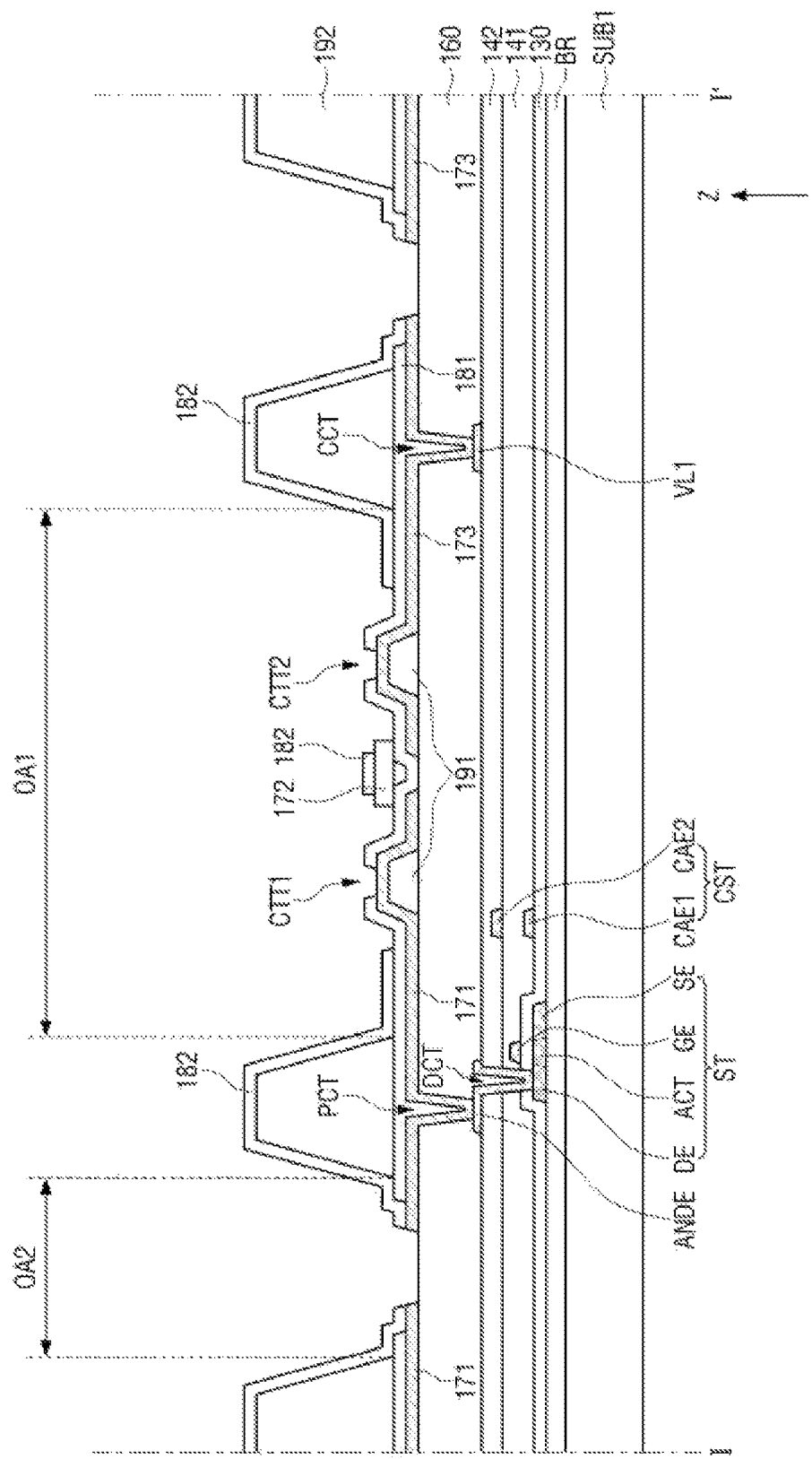

Fifth, referring to FIGS. 16 and 21, the first and second electrodes 171 and 173 are formed by disconnecting the first and second alignment lines AL1 and AL2, respectively (S150).

For example, the first and second alignment lines AL1 and AL2 may be disconnected by etching away portions of the first and second alignment lines AL1 and AL2 that are exposed in the second opening OA1, using the second insulating film 182 as a mask.

Figure 22:
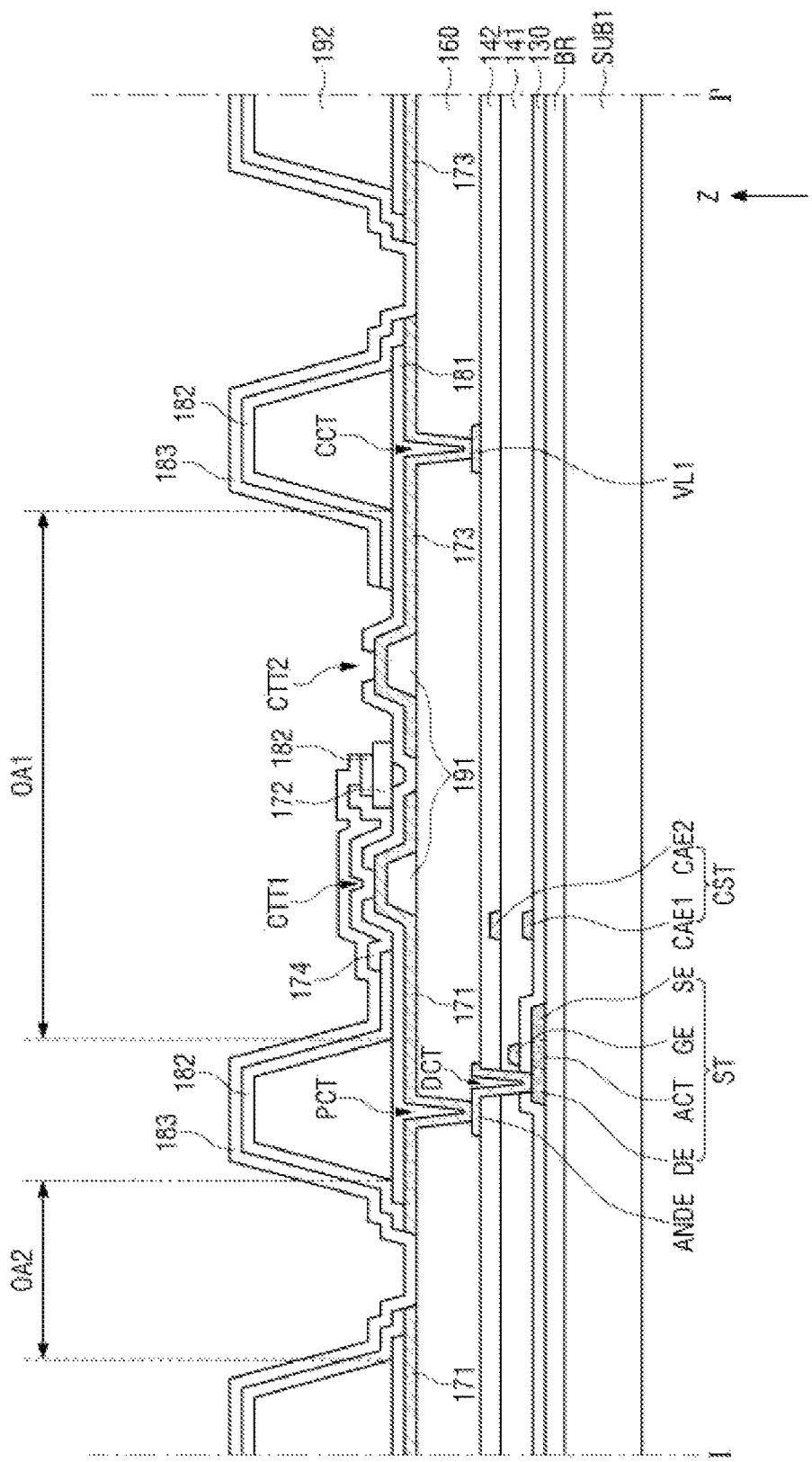

Sixth, referring to FIGS. 16 and 22, a first contact electrode 174, which contacts the first ends of the light-emitting elements 172, is formed (S160).

For example, a first contact hole CTT1, which exposes the first electrode 171, and a second contact hole CTT2, which exposes the second electrode 173, are formed at the same time by penetrating the first insulating film 181 via photolithography.

Thereafter, the first contact electrode 174 is formed on the first insulating film 181 via photolithography. The first contact electrode 174 may be electrically connected to the first electrode 171 through the first contact hole CTT1.

Thereafter, a third insulating film 183 is formed by depositing an inorganic material on the first contact electrode 174.

Figure 23:
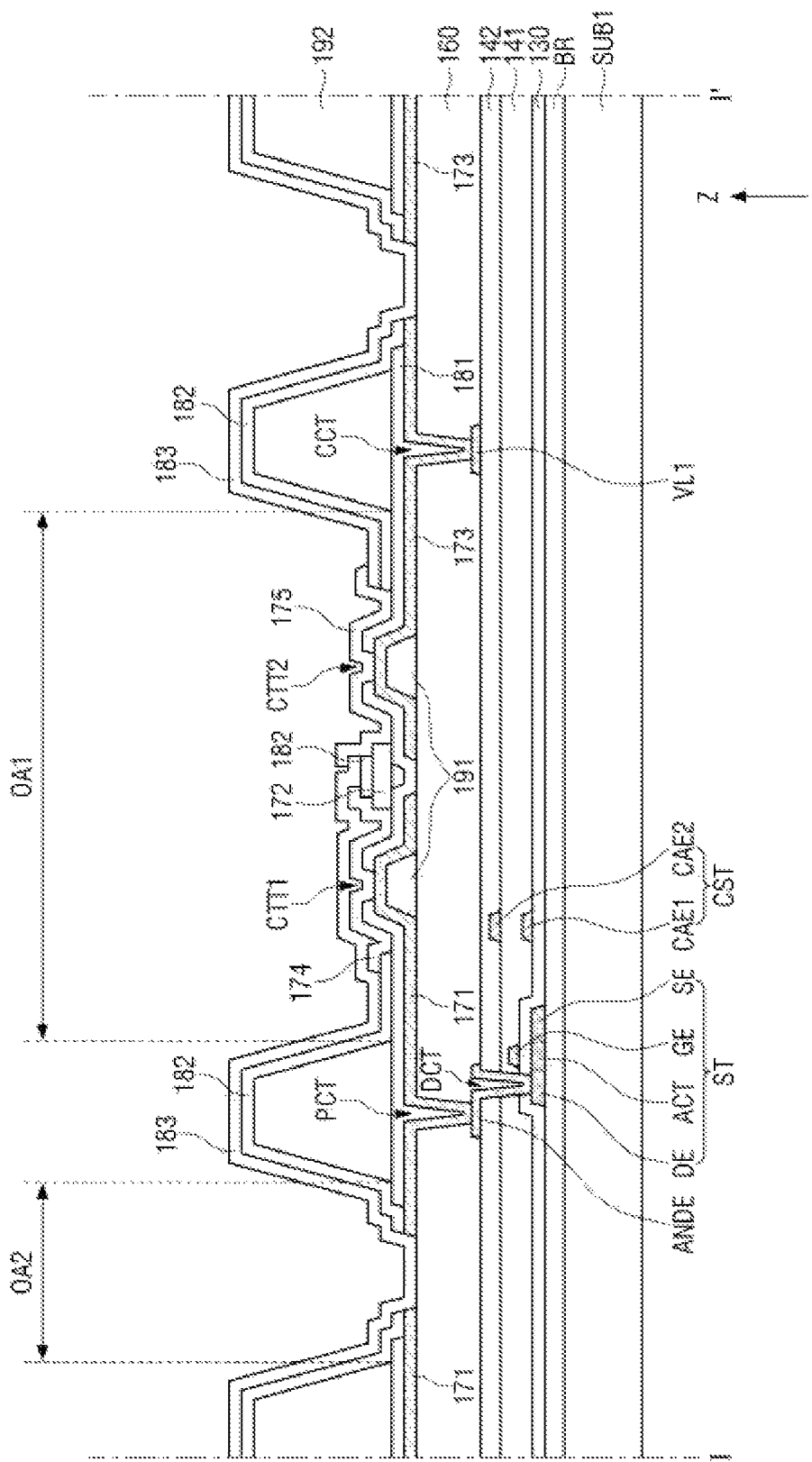

Seventh, referring to FIGS. 16 and 23, a second contact electrode 175, which contacts the second ends of the light-emitting elements 172, is formed (S170).

For example, the second contact electrode 175 is formed on the first insulating film 181 via photolithography. The second contact electrode 175 may be electrically connected to the second electrode 173 through the second contact hole CTT2.

Figure 24:
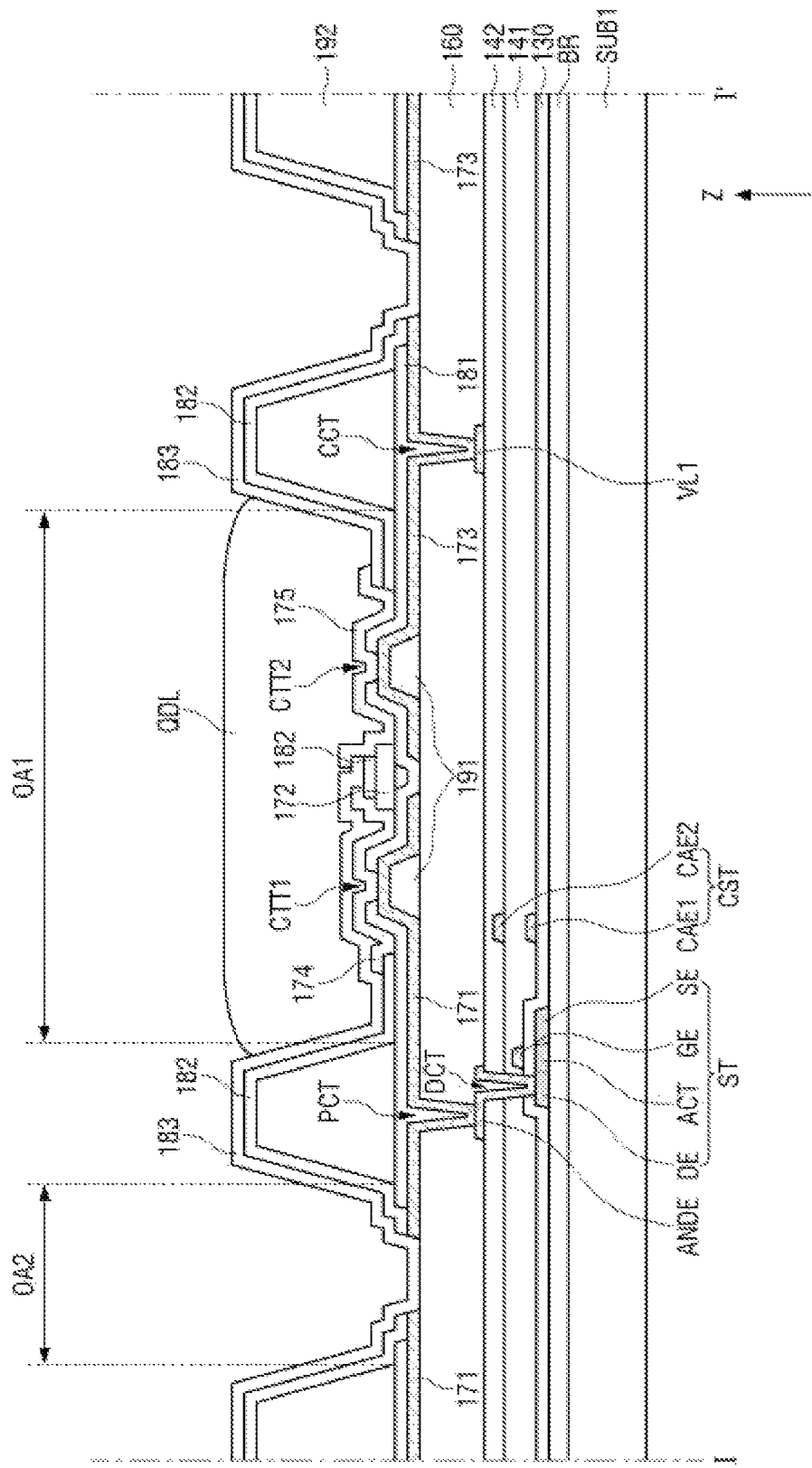

Eighth, referring to FIGS. 16 and 24, a first wavelength conversion layer QDL, a second wavelength conversion layer, or a transparent insulating film is formed on the light-emitting elements 172 (S180).

The first wavelength conversion layer QDL may be disposed in a first subpixel PX1, the second wavelength conversion layer may be disposed in a second subpixel PX2, and the transparent insulating film may be disposed in a third subpixel PX3.

Figure 25:
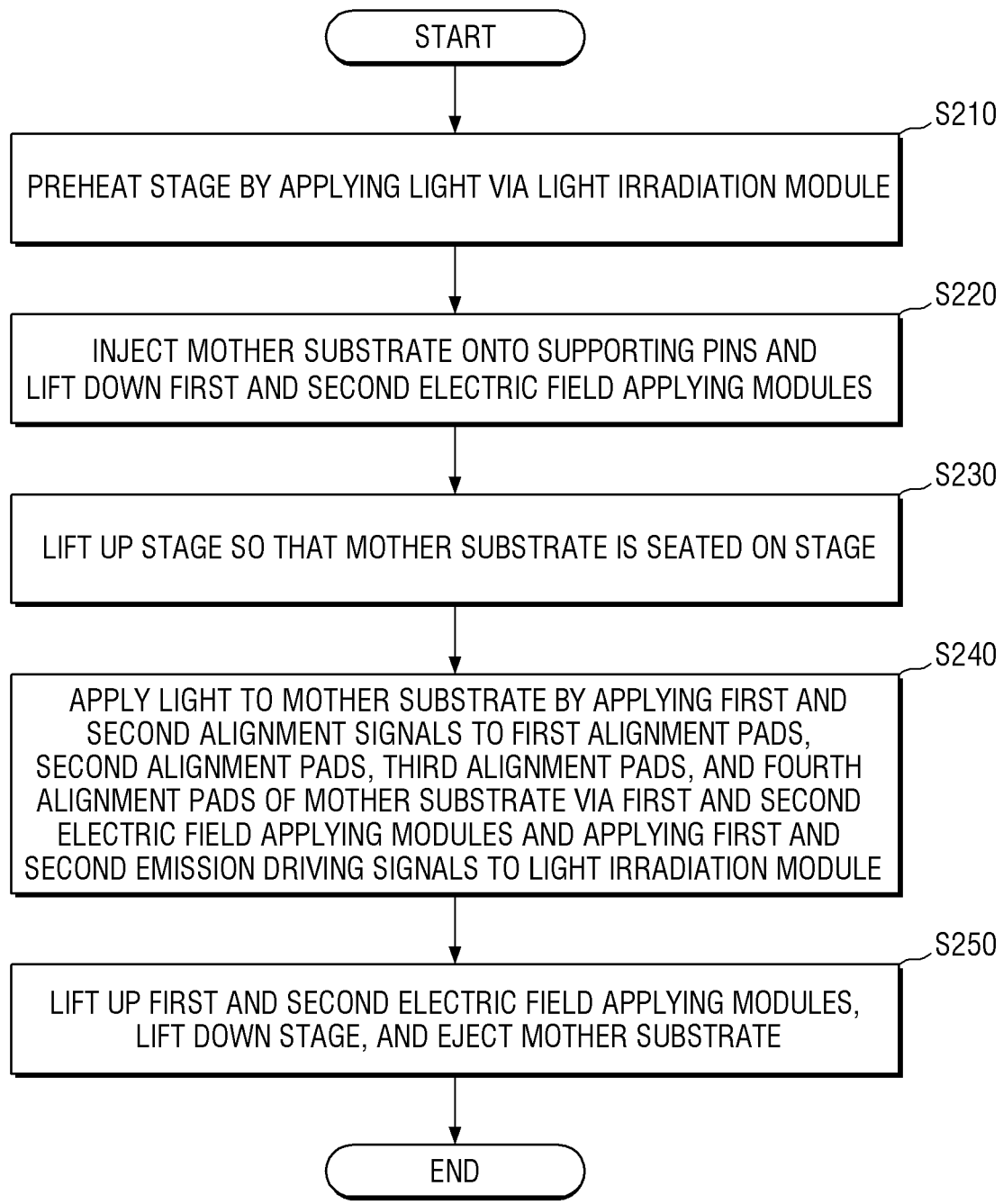
FIG. 25 is a flowchart illustrating a method of aligning light-emitting elements according to an embodiment.

FIG. 25 is a flowchart illustrating a method of aligning light-emitting elements according to an embodiment. FIGS. 26 through 29 are side views of the apparatus of FIG. 6 for explaining the method of FIG. 16. S130 of FIG. 16 will hereinafter be described with reference to FIGS. 25 through 29.

Figure 26:
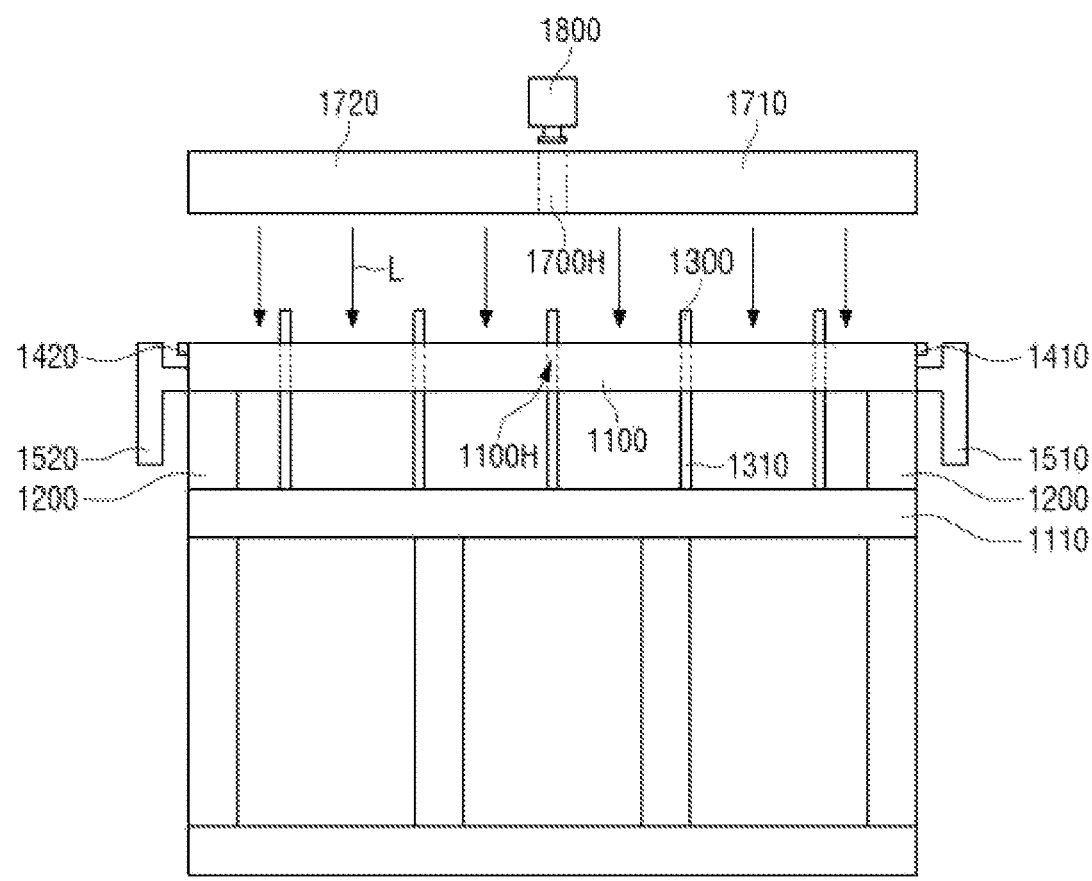
FIGS. 26 through 29 are side views of the apparatus of FIG. 6 for explaining the method of FIG. 16.

Referring to FIGS. 25 and 26, the stage 1100 is preheated by applying light L via the light irradiation module 1700. The light irradiation module 1700 may apply the light L until the stage 1100 is heated up to a temperature in a range of about 50° C. to about 70° C. (S210).

If the temperature of the stage 1100 is lower than about 50° C., the viscosity of the solution SOL may increase, and as a result, the fluidity of the light-emitting elements 172 may decrease. If the temperature of the stage 1100 is higher than about 70° C., the solution SOL may reach its melting point. Thus, the stage 1100 may be preheated to a temperature in a range of about 50° C. to about 70° C.

As an emission driving signal does not need to be synchronized with the first and second alignment signals AS1 and AS2 during the preheating of the stage 1100, the controller 1900 may generate the third emission driving signal LDS3 and may output the third emission driving signal LDS3 to the first and second light irradiation units 1710 and 1720 of the light irradiation module 1700. The LEDs of each of the first and second light irradiation units 1710 and 1720 may emit the light L in accordance with the third emission driving signal LDS3. To quickly raise the temperature of the stage 1100, the duty ratio of the third emission driving signal LDS3 may be greater than the duty ratio of the first or second emission driving signal LDS1 or LDS2. The controller 1900 may analyze temperature data provided by the temperature sensors 1125 of the sensor devices 1120 and may not output the third emission driving signal LDS3 if the temperature of the stage 1100 is about 60° C.

Figure 27:
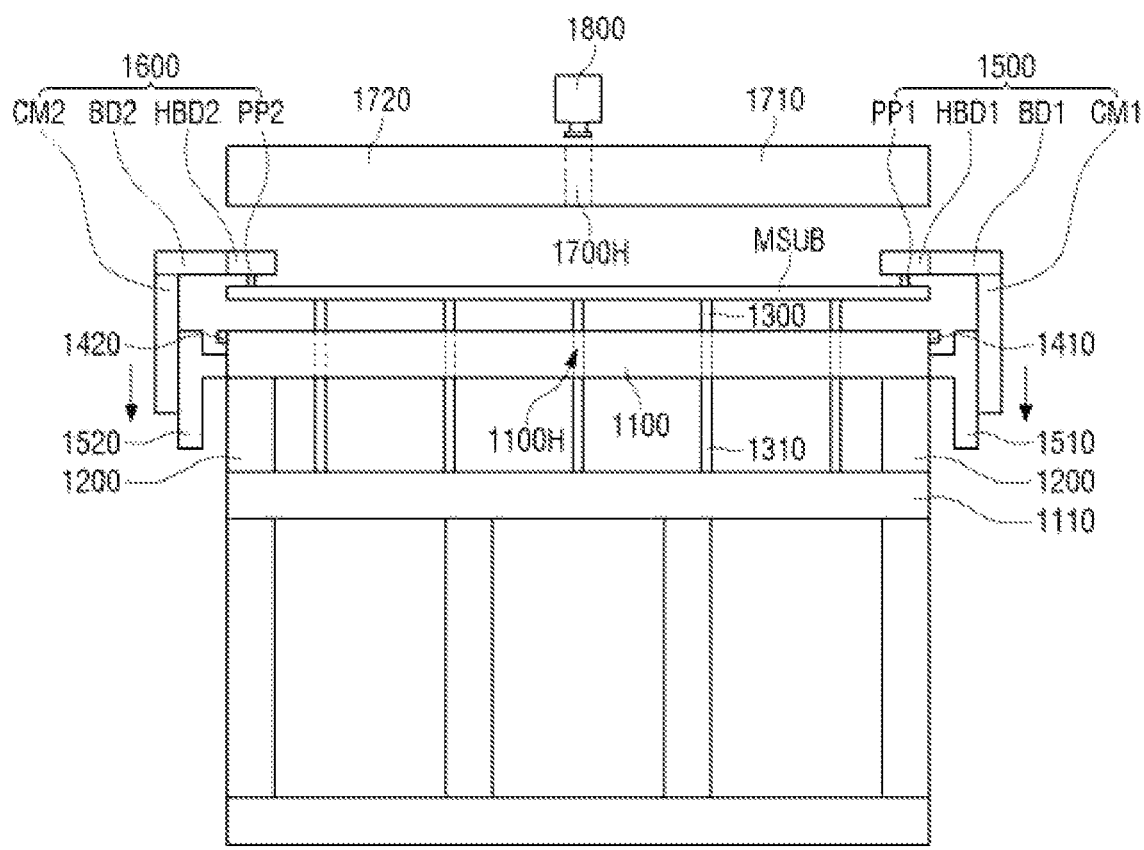

Thereafter, referring to FIGS. 25 and 27, the mother substrate, or other substrate, MSUB is injected onto or may be disposed onto the supporting pins 1300, and the first and second electric field applying modules 1500 and 1600 are lifted down (S220).

The controller 1900 may inject the mother substrate MSUB onto the supporting pins 1300 with the use of, for example, a robot. The controller 1900 may output a second-level first module moving signal MVS1 to the first module mover 1510 and may output a second-level second module moving signal MVS2 to the second module mover 1520. The first module mover 1510 may lift down or lower the first electric field applying module 1500 by a height in accordance with the second-level first module moving signal MVS1, and the second module mover 1520 may lift down or lower the second electric field applying module 1600 by a height in accordance with the second-level second module moving signal MVS2.

In case that the first electric field applying module 1500 is lifted down, the first probe pins PP1 may contact the first alignment pads AP1 and the second alignment pads AP2 of the mother substrate MSUB. Also, in case that the second electric field applying module 1600 is lifted down, the second probe pins PP2 may contact the third alignment pads AP3 and the fourth alignment pads AP4 of the mother substrate MSUB.

Figure 28:
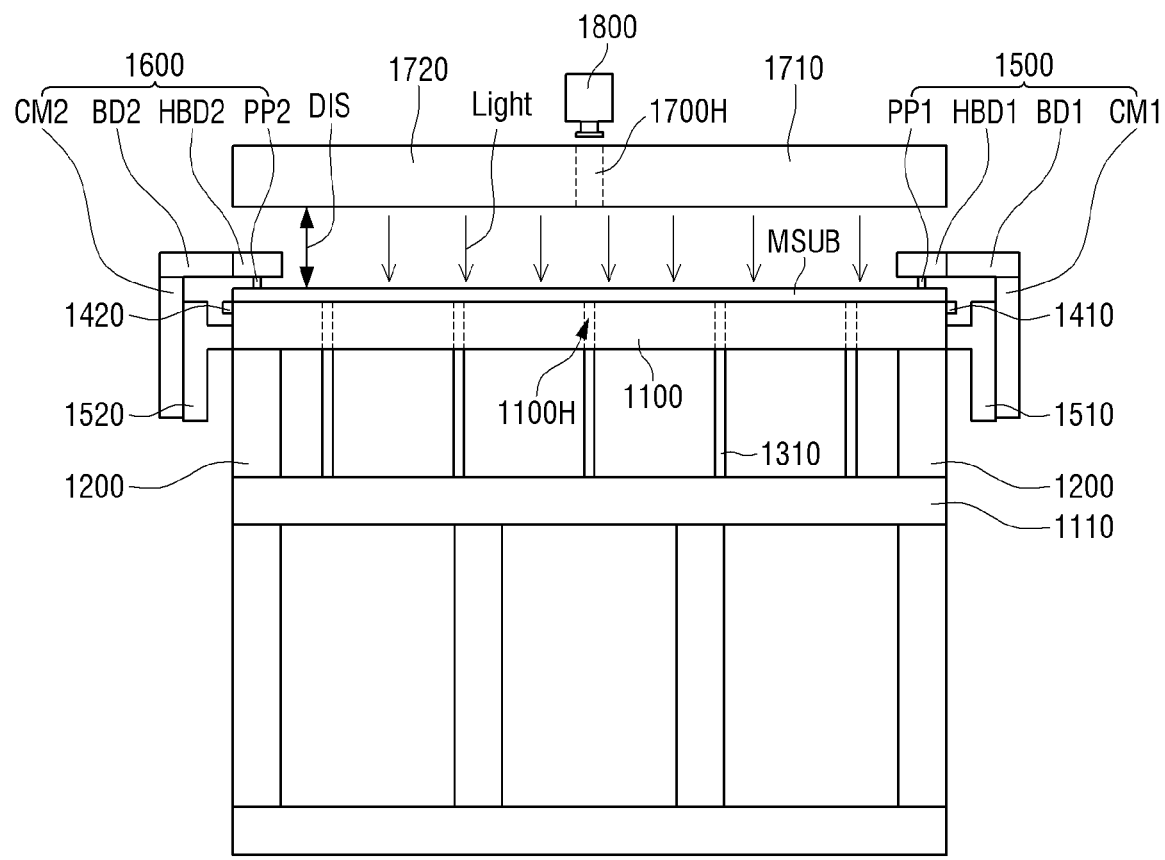

Thereafter, referring to FIGS. 25 and 28, the stage 1100 is lifted up so that the mother substrate MSUB may be seated on the top surface of the stage 1100 (S230).

The controller 1900 outputs a first-level stage control signal SCS to the stage mover 1200. The stage mover 1200 lifts up or raises the stage 1100 by a height in accordance with the first-level stage control signal SCS. The mother substrate MSUB may be seated on the top surface of the stage 1100.

Thereafter, referring to FIG. 25, the first and second alignment signals SS1 and SS2 are applied to the first alignment pads AP1, the second alignment pads AP2, the third alignment pads AP3, and the fourth alignment pads AP4 of the mother substrate MSUB via the first and second electric field applying modules 1500 and 1600, and light is applied to the mother substrate MSUB by applying the first and second emission driving signals LDS1 and LDS2 to the light irradiation module 1700 (S240).

The controller 1900 may output the first and second alignment signals AS1 and AS2 to the first and second voltage output modules 1410 and 1420, respectively. The first alignment signal AS1 may be a ground voltage or a DC voltage. The second alignment signal AS2 may be an AC voltage.

The first voltage output module 1410 may generate the first emission driving signal LDS1 based on the second alignment signal AS2 and may output the first and second alignment signals AS1 and AS2 to the first electric field applying module 1500. The first alignment signal AS1 may be applied to the first alignment pads AP1 of the mother substrate MSUB via the first probe pins PP1 of the first electric field applying module 1500, and the second alignment signal AS2 may be applied to the second alignment pads AP2 of the mother substrate MSUB via the first probe pins PP1 of the first electric field applying module 1500.

The second voltage output module 1420 may generate the second emission driving signal LDS2 based on the second alignment signal AS2 and may output the first and second alignment signals AS1 and AS2 to the second electric field applying module 1600. The first alignment signal AS1 may be applied to the third alignment pads AP3 of the mother substrate MSUB via the second probe pins PP2 of the second electric field applying module 1600, and the second alignment signal AS2 may be applied to the fourth alignment pads AP4 of the mother substrate MSUB via the second probe pins PP2 of the second electric field applying module 1600.

The first alignment signal AS1 may be applied to the first alignment line AL1 of each of the first and second display panel cells CEL1 and CEL2, and the second alignment signal AS2 may be applied to the second alignment line AL2 of each of the first and second display panel cells CEL1 and CEL2. Thus, the light-emitting elements 172 of each of the subpixels (PX1, PX2, and PX3) of the display panel 100 can be aligned by an electric field formed by the first alignment signal AS1 from the first alignment line AL1 and the second alignment signal AS2 from the second alignment line AL2.

The first voltage output module 1410 may generate the first emission driving signal LDS1 in accordance with the second alignment signal AS2. In one example, the second alignment signal AS2 may repeatedly increase from a first low-level voltage to a first high-level voltage and decrease from the first high-level voltage to the first low-level voltage. In this example, the first voltage output module 1410 may generate a first emission driving signal LDS having a second high-level voltage during a period in case that the second alignment signal AS2 is being switched from a first voltage to a second voltage and having a second low-level voltage during other periods.

The second voltage output module 1420 may generate the second emission driving signal LDS2 in accordance with the second alignment signal AS2. In one example, the second voltage output module 1420 may generate a second emission driving signal LDS2 having the second high-level voltage during a period in case that the second alignment signal AS2 is being switched from the first voltage to the second voltage and having the second low-level voltage during other periods.

The LEDs of the first light irradiation module 1710 may emit light in accordance with the first emission driving signal LDS1. The LEDs of the second light irradiation module 1720 may emit light in accordance with the second emission driving signal LDS2. The first and second emission driving signals LDS1 and LDS2 are generated based on the second alignment signal AS2 and can thus be synchronized with the second alignment signal AS2.

If a distance DIS between the light irradiation module 1710 and the mother substrate MSUB is smaller than about 10 mm or greater than about 50 mm, the uniformity of light applied to the mother substrate MSUB may decrease. Thus, the distance DIS between the light irradiation module 1710 and the mother substrate MSUB may be in a range of about 10 mm to about 50 mm, or, as an example, about 30 mm.

Figure 29:
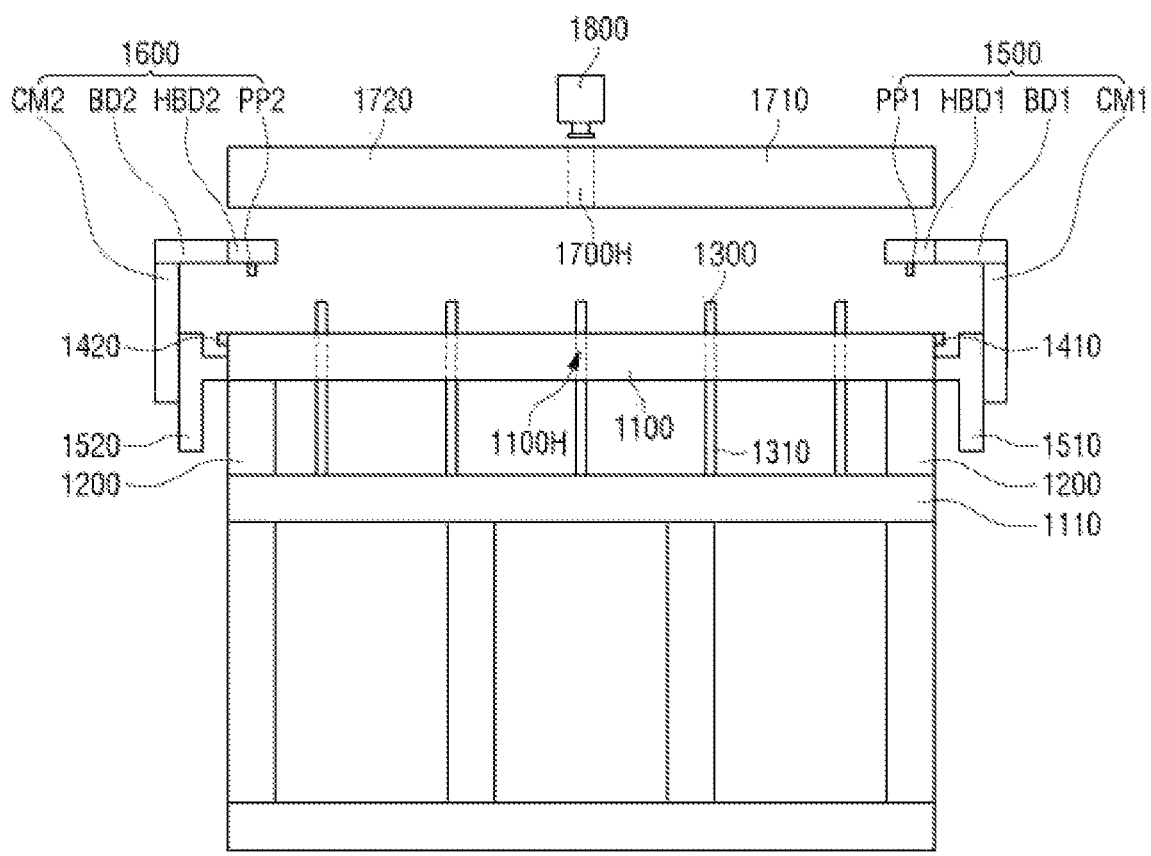

Thereafter, referring to FIGS. 25 and 29, after the application of the first and second alignment signals AS1 and AS2 and the application of the first and second emission driving signals LDS1 and LDS2, the first and second electric field applying modules 1500 and 1600 are lifted up, the stage 1100 is lifted down, and the mother substrate MSUB is ejected from the apparatus 1000 (S250).

The controller 1900 may output a first-level first module moving signal MVS1 to the first module mover 1510 and a first-level second module moving signal MVS2 to the second module mover 1520. The first module mover 1510 lifts up or raises the first electric field applying module 1500 by a height in accordance with the first-level first module moving signal MVS1, and the second module mover 1520 lifts up or raises the second electric field applying module 1600 by a height in accordance with the first-level second module moving signal MVS2.

Thereafter, the controller 1900 outputs a second-level stage control signal SCS to the stage mover 1200. The stage mover 1200 lifts down or lowers the stage 110 by a height in accordance with the second-level stage control signal SCS. As a result, the supporting pins 1300 of the mother substrate MSUB can protrude from the top surface of the stage 1100, and the mother substrate MSUB can be supported by the supporting pins 1300 of the mother substrate MSUB. Thereafter, the mother substrate MSUB may be ejected from the apparatus 1000 via, for example, a robot.

While embodiments are described above, it is not intended that these embodiments describe all possible forms or combinations thereof. Rather, the words used in the specification are words of description rather than limitation, and it is understood that various changes may be made without departing from the spirit and scope of the disclosure. The features of various embodiments may be combined to form further embodiments.

What is claimed is:

1. An apparatus for manufacturing a display device, comprising:
    a stage;
    a first electric field applying module including first probe pins and disposed on a first side of the stage;
    a light irradiation module including light-emitting elements and disposed on the stage; and
    a first voltage output module that outputs an emission driving signal that drives the light-emitting elements, outputs a first alignment signal to one of the first probe pins, and outputs a second alignment signal to another one of the first probe pins.

2. The apparatus of claim 1, wherein
    the first alignment signal of the first voltage output module is a ground voltage or a direct current voltage, and
    the second alignment signal of the first voltage output module is an alternating current voltage.

3. The apparatus of claim 1, wherein the second alignment signal of the first voltage output module increases from a first low-level voltage to a first high-level voltage and decreases from the first high-level voltage to the first low-level voltage.

4. The apparatus of claim 3, wherein the emission driving signal of the first voltage output module has a second high-level voltage during a period in which the second alignment signal of the first voltage output module is switched from a first-level voltage to a second-level voltage and has a second low-level voltage lower than the second high-level voltage during other periods.

5. The apparatus of claim 4, wherein the first-level voltage and the second-level voltage are lower than the first high-level voltage and higher than the first low-level voltage of the first voltage output module.

6. The apparatus of claim 3, wherein the second alignment signal of the first voltage output module has a sawtooth waveform such that a period over which the second alignment signal increases from the first low-level voltage to the first high-level voltage is shorter than a period over which the second alignment signal of the first voltage output module decreases from the first high-level voltage to the first low-level voltage of the first voltage output module.

7. The apparatus of claim 3, wherein the second alignment signal of the first voltage output module has a ramp waveform such that a period over which the second alignment signal of the first voltage output module increases from the first low-level voltage to the first high-level voltage is longer than a period over which the second alignment signal decreases from the first high-level voltage to the first low-level voltage of the first voltage output module.

8. The apparatus of claim 1, further comprising:
    a second electric field applying module including second probe pins and disposed on a second side of the stage; and
    a second voltage output module outputting the first alignment signal to one of the second probe pins and outputting the second alignment signal to another one of the second probe pins.

9. The apparatus of claim 8, wherein
    the first voltage output module is disposed on the first side of the stage,
    the second voltage output module is disposed on the second side of the stage, and
    the first side of the stage is opposite to the second side of the stage.

10. The apparatus of claim 1, further comprising:
    an optical device disposed on the light irradiation module and overlapping a through hole of the light irradiation module.

11. The apparatus of claim 1, further comprising a sensor device including:
- a light detection sensor that detects light from the light irradiation module; and
- a temperature sensor that detects a temperature of the stage.

12. The apparatus of claim 11, wherein the stage includes a sensor groove in which the sensor device is inserted.

13. The apparatus of claim 12, wherein the stage includes a line hole that penetrates the stage.

14. The apparatus of claim 13, further comprising:
- a sensor connecting line electrically connected to the sensor device and disposed in the line hole.

15. The apparatus of claim 1, further comprising:
- a first module mover lifting up or down the first electric field applying module; and
- a stage mover lifting up or down the stage.

16. A method of manufacturing a display device, comprising:
- disposing a substrate onto supporting pins that protrude from a top surface of a stage;
- lowering a first electric field applying module such that alignment pads of the substrate contact first probe pins of the first electric field applying module, the first electric filed applying module being disposed on a first side of the stage;
- seating the substrate on the stage by raising the stage; and
- applying light to the substrate by applying a first alignment signal to first alignment pads by the first probe pins of the first electric field applying module;
- applying a second alignment signal to second alignment pads by the first probe pins of the first electric field applying module; and
- applying an emission driving signal to a light irradiation module disposed on the stage.

17. The method of claim 16, wherein
the first alignment signal applied to the first alignment pads is a ground voltage or a direct current voltage, and
the second alignment signal applied to the second alignment pads is an alternating current voltage.

18. The method of claim 17, wherein the second alignment signal applied to the second alignment pads increases from a first low-level voltage to a first high-level voltage and decreases from the first high-level voltage to the first low-level voltage.

19. The method of claim 18, wherein the emission driving signal applied to the light irradiation module has a second high-level voltage during a period in which the second alignment signal applied to the second alignment pads is switched from a first-level voltage to a second-level voltage and has a second low-level voltage lower than the second high-level voltage during other periods.

20. The method of claim 19, wherein the first-level voltage and the second-level voltage are lower than the first high-level voltage and higher than the first low-level voltage.

21. The method of claim 20, wherein the second alignment signal applied to the second alignment pads has a sawtooth waveform such that a period over which the second alignment signal applied to the second alignment pads increases from the first low-level voltage to the first high-level voltage is shorter than a period over which the second alignment signal applied to the second alignment pads decreases from the first high-level voltage to the first low-level voltage.

22. The method of claim 20, wherein the second alignment signal applied to the second alignment pads has a ramp waveform such that a period over which the second alignment signal applied to the second alignment pads increases from the first low-level voltage to the first high-level voltage is longer than a period over which the second alignment signal applied to the second alignment pads decreases from the first high-level voltage to the first low-level voltage.

23. The method of claim 16, further comprising:
applying light to the light irradiation module to preheat the stage before the disposing the substrate onto the supporting pins.

24. The method of claim 23, wherein the stage is preheated to a temperature in a range of about 50° C. to about 70° C.

25. The method of claim 18, further comprising:
raising the first electric field applying module;
lowering the stage; and
ejecting the substrate.

* * * * *